(12) United States Patent
Abe et al.

(10) Patent No.: US 10,804,449 B2
(45) Date of Patent: Oct. 13, 2020

(54) METHOD FOR MANUFACTURING PACKAGE, AND METHOD FOR MANUFACTURING LIGHT EMITTING DEVICE

(71) Applicant: NICHIA CORPORATION, Anan-shi, Tokushima (JP)

(72) Inventors: Koji Abe, Tokushima (JP); Tomohisa Kishimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/209,339

(22) Filed: Dec. 4, 2018

(65) Prior Publication Data

US 2019/0103531 A1    Apr. 4, 2019

Related U.S. Application Data

(62) Division of application No. 15/099,693, filed on Apr. 15, 2016, now Pat. No. 10,181,552.

(30) Foreign Application Priority Data

Apr. 28, 2015  (JP) .................. 2015-091601

(51) Int. Cl.
*H01L 33/60* (2010.01)
*H01L 33/48* (2010.01)

(52) U.S. Cl.
CPC ............ *H01L 33/60* (2013.01); *H01L 33/486* (2013.01); *H01L 2224/48091* (2013.01);
(Continued)

(58) Field of Classification Search
CPC ............. H01L 33/60; H01L 2933/0058; H01L 2924/181; H01L 2924/00014;
(Continued)

(56) References Cited

U.S. PATENT DOCUMENTS

2003/0020077 A1    1/2003  Horiuchi et al.
2004/0061440 A1    4/2004  Imai et al.
(Continued)

FOREIGN PATENT DOCUMENTS

JP    2004-127604 A    4/2004
JP    2004-363503 A    12/2004
(Continued)

OTHER PUBLICATIONS

Non Final Office Action of the initial U.S. Appl. No. 15/099,693, dated Jan. 11, 2017.
(Continued)

*Primary Examiner* — Vongsavanh Sengdara
(74) *Attorney, Agent, or Firm* — Global IP Counselors, LLP

(57) ABSTRACT

A method for manufacturing a package includes molding a precursor of a package including a cup-shaped resin component having a bottom surface and side walls, an opening opened at an upper part of the side walls, and a pair of leads exposed on the bottom surface. The side walls include a side wall that extends along the Y axis and the X axis and that has a first outer surface, and a side wall that extends along the Y axis and the Z axis. A thickness of the side wall extending along Y axis and the X axis is less than a thickness of the side wall extending along axis and the Z axis. The first outer surface has a recess which is recessed in the Z axis direction and arranged in a position corresponding to the opening. The method further includes forming a reflective film in the recess.

20 Claims, 12 Drawing Sheets

(52) U.S. Cl.
CPC ............... *H01L 2224/48247* (2013.01); *H01L 2224/48257* (2013.01); *H01L 2924/181* (2013.01); *H01L 2933/0058* (2013.01)

(58) Field of Classification Search
CPC . H01L 2924/00012; H01L 2224/48091; H01L 2224/48247; H01L 2224/48257; H01L 33/486
See application file for complete search history.

(56) References Cited

U.S. PATENT DOCUMENTS

| | | |
|---|---|---|
| 2007/0081313 A1 | 4/2007 | Tanaka et al. |
| 2008/0048201 A1 | 2/2008 | Kim et al. |
| 2008/0210966 A1 | 9/2008 | Sakamoto et al. |
| 2008/0261339 A1 | 10/2008 | Koung et al. |
| 2009/0134411 A1 | 5/2009 | Kitani et al. |
| 2009/0236618 A1 | 9/2009 | Yasuda |
| 2010/0025722 A1 | 2/2010 | Wada |
| 2011/0175127 A1 | 7/2011 | Kanada et al. |
| 2012/0161180 A1 | 6/2012 | Komatsu et al. |
| 2013/0205708 A1* | 8/2013 | Shaw .................... E04G 21/00 52/742.12 |
| 2013/0277701 A1 | 10/2013 | Okabe et al. |
| 2014/0327024 A1 | 11/2014 | Ishihara et al. |
| 2014/0328046 A1* | 11/2014 | Aanegola ................ F21K 9/68 362/84 |
| 2014/0328083 A1* | 11/2014 | Oh ........................ H01L 33/62 362/612 |
| 2015/0155459 A1 | 6/2015 | Ishihara et al. |

FOREIGN PATENT DOCUMENTS

| | | |
|---|---|---|
| JP | 2007-158009 A | 6/2007 |
| JP | 2008-053726 A | 3/2008 |
| JP | 2008-160032 A | 7/2008 |
| JP | 2008-187030 A | 8/2008 |
| JP | 2009-032851 A | 2/2009 |
| JP | 2011-187552 A | 9/2011 |
| JP | 2012-174979 A | 9/2012 |
| JP | 2014-130903 A | 7/2014 |
| WO | 2013-018783 A1 | 3/2015 |

OTHER PUBLICATIONS

Final Office Action of the initial U.S. Appl. No. 15/099,693, dated Jul. 10, 2017.
Advisory Action of the initial U.S. Appl. No. 15/099,693, dated Nov. 9, 2017.
Notice of Allowance of the initial U.S. Appl. No. 15/099,693, dated Sep. 6, 2018.

* cited by examiner

METHOD FOR MANUFACTURING PACKAGE, AND METHOD FOR MANUFACTURING LIGHT EMITTING DEVICE

CROSS-REFERENCE TO RELATED APPLICATIONS

This application is a divisional application of U.S. patent application Ser. No. 15/099,693 filed on Apr. 15, 2016. This application claims priority to Japanese Patent Application No. 2015-091601 filed on Apr. 28, 2015. The entire disclosures of U.S. patent application Ser. No. 15/099,693 and Japanese Patent Application No. 2015-091601 are hereby it herein by reference.

BACKGROUND

1. Technical Field

The present disclosure relates to a package, a light emitting device and a method for manufacturing these.

2. Description of Related Art

As electronic products have become smaller, LEDs (light emitting diodes) have also become more compact and more efficient. In particular, as television sets, personal computers, cell phones, and other devices with liquid crystal displays become thinner, side-view LED products used for backlights have come out with a height of 0.4 mm.

A known example of a side-view light emitting device is a light emitting diode package in which a light emitting diode chip is mounted in a cavity, and the light emitted from this light emitting diode chip is emitted witha a certain viewing angle (for example, JP2008-53726A1). This light emitting diode package has a bottom part that includes a region for mounting the light emitting diode chip, a first lead terminal having one reflection surface formed by bending the bottom part, a second lead terminal that is separated from the first lead terminal, and a package main body that supports the first lead terminal and the second lead terminal.

There has also been proposed a light emitting device in which an external reflector plate made of thin sheet metal is provided to the outer surface of a package (for example, JP2004-363503A1).

Further, there has been proposed a light emitting device in which the upper surface of a white substrate of a side-view package is cut, and a reflective film is attached to this cut surface (for example, JP2008-187030A1).

SUMMARY

A package of the present disclosure includes; a cup-shaped resin component having a bottom surface and side walls that surround the bottom surface, an opening which is opened at an upper part of the side walls, a pair of leads exposed on part of the bottom surface, and a reflective film, the resin component having a 3-D shape defined by an X axis, a Y axis that is perpendicular tai the X axis and a Z axis that is perpendicular to the X and axes, the opening of the upper part of the side walls extending in the X axis direction and the Z axis direction, and being longer in the X axis direction than in the Z axis direction, the side walls including at least one side wall that extends along the Y axis and the X axis and has a first outer surface, and at least one of another side wall that extends along the Y axis and the Z axis, a thickness of the side wall extending alone Y axis and the X axis is less than a thickness of the side wall extending along Y axis and the Z axis, the first, outer surface of the side walls that has a recess which is recessed in the Z axis direction and arranged in a position corresponding to the opening, and the reflective film being disposed in the recess.

A light emitting device of the present disclosure includes; the package according to the above and a light emitting element mounted over the pair of leads on the bottom surface.

A backlight light source of the present disclosure includes; a light emitting device having the package according to the above, a light emitting element mounted on the pair of leads on the bottom surface, and a light-transmissive member that covers the light emitting element; and a flat light guide having a main surface, a rear surface and side surfaces that are opposite the recesses of the light emitting device.

A method for manufacturing a package of the present disclosure includes; molding a precursor of a package comprising a cup-shaped resin component having a bottom surface and side walls that surround the bottom surface, an opening which is opened at an upper part of the side walls, a pair of leads exposed on part of the bottom surface, and a reflective film, the resin component having a 3-D shape defined by an X axis, a Y axis that is perpendicular to the X axis and a Z axis that is perpendicular to the X and Y axes, the opening of the upper part of the side walls extending in the X axis direction and the Z axis direction, and being longer in the X axis direction than in the Z axis direction, the side walls including at least one side wall that extends along the Y axis and the X axis and has a first outer surface, and at least one of another side wall that, extends along the Y axis and the Z axis, a thickness of the side wall extending along NI axis and the X axis is less than a thickness of the side wall extending along Y axis and the Z axis, the first outer surface of the side walls that has a recess which is recessed in the Z axis direction and arranged in a position corresponding to the opening, and forming a reflective film in the recess.

A method fix manufacturing a light emitting device of the present disclosure includes; molding a precursor of a package comprising a cup-shaped resin component having a bottom surface and side walls that surround the bottom surface, an opening which is opened at an upper part of the side walls, a pair of leads exposed on part of the bottom surface, and a reflective film, the resin component having a 3-D shape defined by an X axis, a Y axis that is perpendicular to the X axis and a Z axis that is perpendicular to the X and Y axes, the opening of the upper part of the side walls extending in the X axis direction and the Z axis direction, and being longer in the X axis direction than in the Z axis direction, the side walls including at least one side wall that extends along the X axis and the X axis and has a first outer surface, and at least one of another side wall that extends along the axis and the Z axis, a thickness of the side wall extending along Y axis and the X axis is less than a thickness of the side wall extending along Y axis and the Z axis, the first outer surface of the side walls that has a recess which is recessed in the Z axis direction and arranged in a position corresponding to the opening, mounting a light emitting element on the pair of leads on the bottom surface; and thrilling a reflective film in the recess.

A light emitting device of the present disclosure includes; a package having a lead frame disposed on the bottom surface of a recess portion, and a resin component that supports the lead frame and forms the side surfaces of the recess portion; and a light emitting element that is electrically connected to the lead frame, a recess is formed in at least part of the outer surface of the recess portion, and the recess is covered by a reflective film.

With the light emitting device and package according to an embodiment of the present invention, good tight extraction efficiency can be obtained. And with the method for manufacturing a light emitting device or the method for manufacturing a package according to an embodiment of the present invention, these can be manufactured very simply.

DETAILED DESCRIPTION OF THE INVENTION

Figure 1:
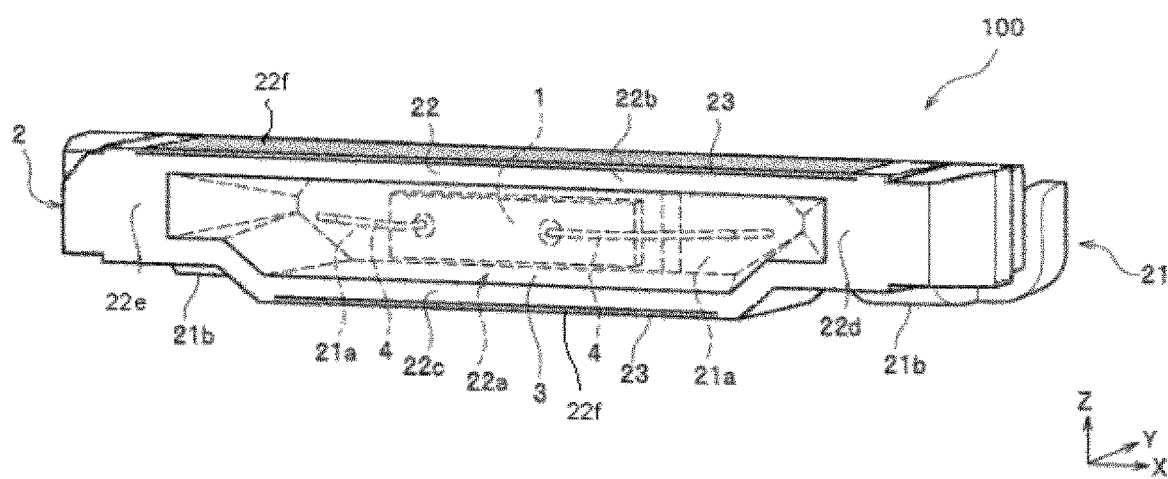
FIG. 1 is an oblique view of the light emitting device according to first embodiment.

Embodiments according to the package, the light emitting device and their manufacturing methods will be described below with reference to the accompanying drawings. In the following embodiment of these that embody the technological concept of the present disclosure are just examples, and unless otherwise specified, the constituent parts discussed in the embodiments are not intended to limit the scope of the present disclosure. The drawings referred to in the following description, for illustrates an embodiment schematically, the scale and spacing of the members, the positional relationship may be exaggerated, or, some of the members may be omitted. Also, the scale and spacing of each member may not match, for example, in plan view and cross sectional view. In the following description, the same names and reference numerals denote the same or equivalent members as a matter of principle, it will be omitted of the detailed description as appropriate.

In describing the package, the light emitting device and their manufacturing methods according to embodiments, terms such as "upper," "lower," "left," and "right" may be interchanged according to the situation. In this Specification, "upper," "lower," and so forth indicate the relative positions between constituent elements in the drawings, which are referred to for description, and are not intended to indicate absolute positions unless otherwise specified.

First Embodiment

Figure 2A:
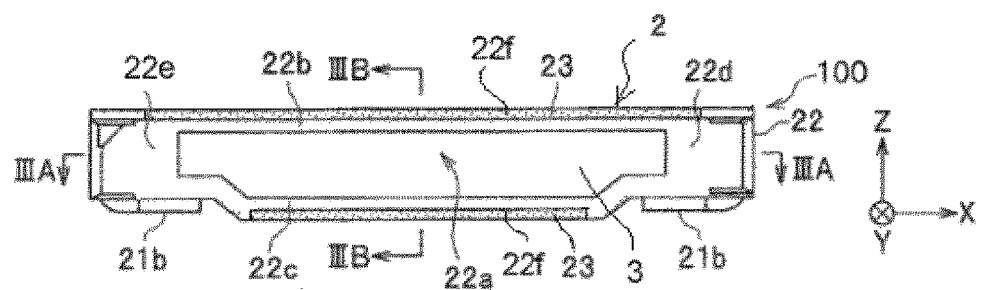
FIG. 2A is a front view of the light emitting device according to first embodiment.
Figure 2B:
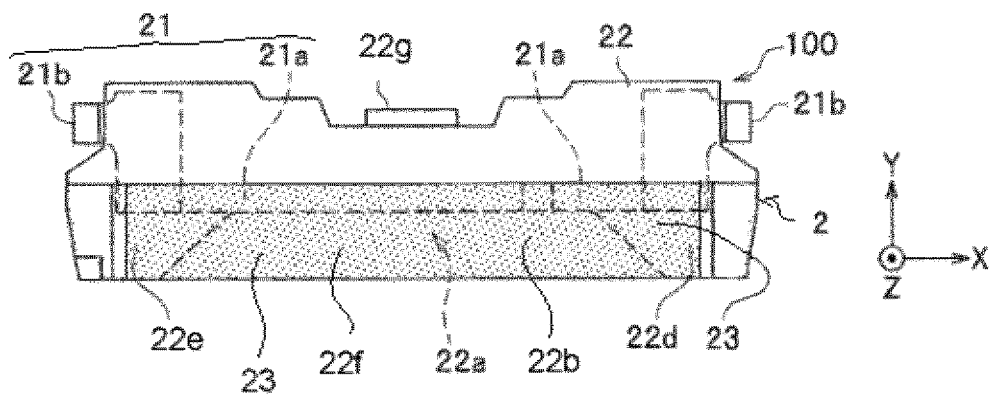
FIG. 2B is a plan top view of the light emitting device according to first embodiment.
Figure 2C:
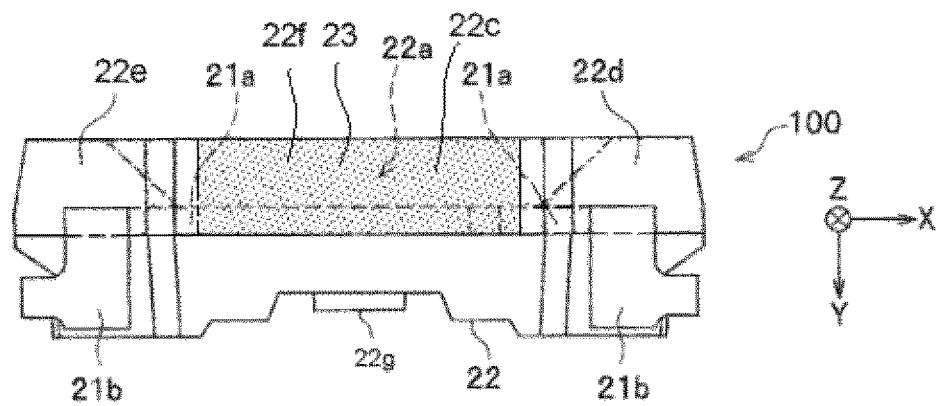
FIG. 2C is a bottom view of the light emitting device according to first embodiment.
Figure 2D:
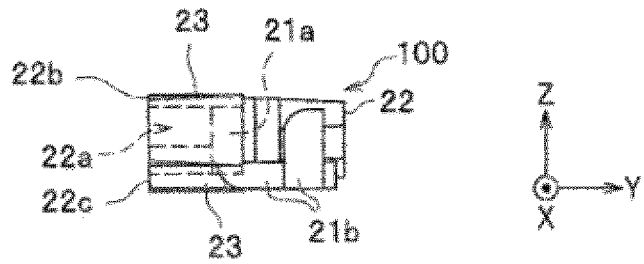
FIG. 2D is a right side view of the light emitting device according to first embodiment.
Figure 3A:
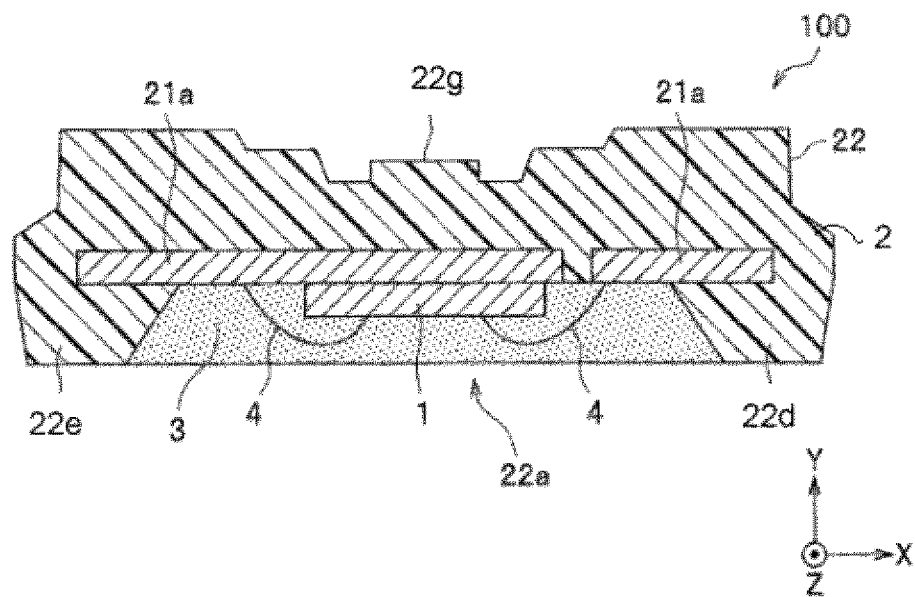
FIG. 3A is a cross section along the IIIA-IIIA line in FIG. 2A.
Figure 3B:
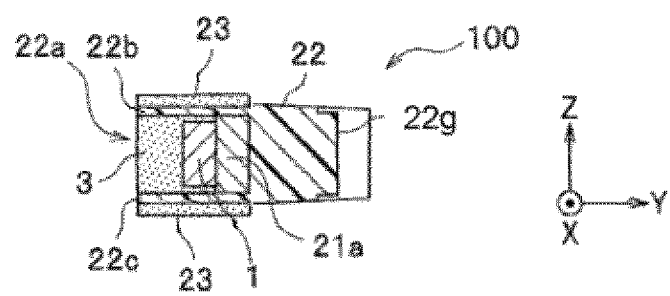
FIG. 3B is a cross section along the IIIB-IIIB line in FIG. 2A.

Referring to FIGS. 1 to 3B, a description will be given of a configuration of a light emitting device according to the first embodiment. FIG. 1 is an oblique view of the light emitting device according to first embodiment, FIG. 2A is a front view of the light emitting device according to first embodiment, FIG. 2B is a plan top view of the light emitting device according to first embodiment, FIG. 2C is a bottom view of the light emitting device according to first embodiment, FIG. 2D is a right side view of the light emitting device according to first embodiment, FIG. 3A is a cross section along the III line in FIG. 2A, FIG. 3B is across section along the IIIB-IIIB line in FIG. 2A.

In the relation between the X, Y, and Z axes, there are the X axis, the Y axis that is perpendicular to the X axis, and the Z axis that is perpendicular to the plane of the X and Y axes. The X, Y, and Z axes all have a positive (+) direction and a negative (−) direction, but unless otherwise specified, the "X axis direction" includes both the positive (+) X axis direction and the negative (−) X axis direction. Coordinate axes are shown in FIGS. 1 to 3B, and for the sake of convenience, FIG. 2A shall be considered a front view looking in the positive direction of the Y axis, FIG. 2B a plan view (top view) looking in the negative direction of the Z axis, FIG. 2C a bottom view looking in the positive direction of the Z axis, and FIG. 2D a right side view looking in the negative direction of the X axis.

The light emitting device 100 according to the first embodiment includes a light emitting element 1, a package 2 and a light-transmissive member 3.

The light emitting element 1 is provided in a cup 22a having an opening on the front of the package 2, and light emitted by the light emitting element 1 is emitted toward the front (the −Y direction) through the opening of the cup 22a via the light-transmissive member 3.

The package 2 has a bottom surface and side walls that surround the bottom surface, and the cup 22a is formed where the upper part of the side walls is open. A pair of leads 21 is disposed on part of the bottom surface of the cup 22a. The light emitting element 1 is mounted on the pair of leads 21 on the bottom surface inside the cup 22a.

The opening at the upper part of the side walls of the cup 22a is longer in the X axis direction than in the Z axis direction. The light emitting device 100 is flattened out in the thickness direction (the Z axis direction) so as to be compatible with light sources used as backlights for liquid crystal displays. The thickness of the side walls extending in the X axis direction is less than the thickness of the side walls extending in the Z axis direction. Because of the need to reduce thickness in light sources used for backlights, the size of the package is reduced in the Z axis direction, and consequently the thickness of the side walls extending in the X axis direction is decreased.

A first outer surface of the side walls extending in the X axis direction has a recess 22f in the Z axis direction, and a reflective film 23 is disposed in this recess 22f. That is, the reflective film 23 is provided to part of the outer surface in the thickness direction of the cup 22a.

The thickness of the reflective film 23 is preferably the same as the depth of the recess 22f, or less than the depth of the recess 22f. This makes it less likely that the reflective film 23 will fall out or separate.

As the light emitting device 100 becomes thinner, the thickness of the side walls of the cup 22a also decreases. In the case where the side walls are thin, light emitted from the light emitting element 1 passes through the side walls of the cup 22a and ends up leaking to the outside. In view of this, the leakage of light to the outside can be reduced by providing the reflective film 23 to the outer surface of the side walls of the cup 22a. Also, providing the recess 22f allows the reflective film 23 to be provided in just the desired location. Furthermore, a thicker portion can be provided on the outside of the recess 22f (both sides in the X axis direction), so the strength of the side walls and the strength of the package can be increased.

In the case where the reflective film 23 is provided at a thicker portion on the outside of the recess 22f, the reflective film 23 may fall out during mounting, work, etc., the debris from the reflective film 23 may adhere to the light-transmissive member 3, and this reduces the optical output of the light emitting device. Thus, providing the reflective film 23 in the recess 22f, which is more to the inside than, the thicker portion on the outside of the recess 22f, prevents the reflective film 23 from falling out, and this in turn prevents a reduction in the optical output of the light emitting device.

The reflective film 23 makes preferably use of a first optically reflective substance that reflects at least 50%, and preferably at least 70%, of the light from the light emitting element 1. The reflective film 23 preferably has the particles of the first optically reflective substance positioned compactly together. That is, the particles of the first optically reflective substance in the reflective film 23 are preferably touching each other, with no gaps in between.

The side walls are preferably such that a second optically reflective substance are contained in a resin component. The second optically reflective substance is preferably in the form of particles. The particle size of the second optically reflective substance is preferably at least ten times larger than the particle size of the first optically reflective substance, and more preferably at least 15 times. The strength of the side walls will be higher in the case where the particle size of the second optically reflective substance is at least ten times larger than the particle size of the first optically reflective substance. Also, the moldability of the package can be enhanced by using a first optically reflective substance with a specific particle size, such as about 0.3 to 0.8 µm.

The density of the first optically reflective substance in the reflective film 23 is preferably higher than the density of the second optically reflective substance contained in the resin component of the side walls. The density of the first optically reflective substance in the reflective film 23 is preferably at least 1.5 times, and more preferably at least two times, higher than the density of the second optically reflective substance contained in the resin component of the side walls.

The side walls extending in the X axis direction are disposed so that a first side wall 22b and, a second side wall 22c are opposite each other. The side wall in the +Z axis direction will be the first side wall 22b and the side wall in the Z axis direction will be the second side wall 22e, using the light emitting element 1 in the cup 22a as the center.

The side walls extending in the Z axis direction are disposed so that a third side wall 22d and a fourth side wall 22e are opposite each other. The side wall in the +X axis direction will be the third side wall 22d and the side wall in the X axis direction will be the fourth side wall 22e, using the light emitting element 1 in the cup 22a as the center.

The outer surface of the first side wall 22b is the first outer surface. The recess 22f is formed in this first outer surface.

The outer surface of the second side wall 22c is the second outer surface. A recess can also be formed in this second outer surface, and a reflective film can also be provided to the recess in the second outer surface.

A pair of leads 21 can also be disposed on the outside of the second side wall 22c. The leads 21 extend in the ±X axis directions from the bottom surface inside the cup 22a, and are disposed within the package 2. Part of the leads 21 disposed within the package 2 and extending in the ±X axis directions extends in the −Z axis direction, and is exposed to the outside from the package 2. Part of the leads 21 exposed to the outside from the package 2 is bent in the +Y axis direction, and part of the leads 21 is bend in, the +Z axis direction. The layout and bending of the leads 21 is not limited to this, however.

The recess 22f is preferably formed on the outer surface, of the opening, that is, the recess 22f is preferably adjacent to the opening. Because the first side wall 22b of the opening is thin, the reflective film 23 is preferably provided to the outer surface of this thin portion.

At a side wall extending in the X axis direction (the first side wall 22b), the end surfaces of the recess 22f in the X axis direction can also be provided to the outside of the open portion. That is, the end surfaces of the recess 22f are formed on the outer surfaces of the first side wall 22b where the third side wall 22d and the fourth side wall 22e are formed. This allows the first side wall 22b to be made thinner, which in turn allows the package 2 to be thinner.

The thickness of the first side wall 22b at the recess 22f portion is preferably from 15 to 100 µm. The thinner is the first side wall 22b, the more pronounced will be the effect of light reflection at the reflective film 23. It is particularly favorable for the thickness of the first side wall 22b at the recess 22f portion to be from 20 to 60 µm.

The depth of the recess 22f in the Z axis direction is preferably from 20 nm to 5 µm, and, more preferably from 20 nm to 3 µn. The reflective film 23 can be given the specified thickness by using a optically reflective substance that has a particle size of at least 20 nm and no more than 500 nm in the reflective film 23. This allows any light that leaks from the first side wall 22b to the outside to be effectively sent back into the cup 22a.

The end surfaces of the recess 22f in the Y axis direction are preferably flush with the lower surface of the two leads 21. Because the first side wall 22b is thin at the opening, the reflective film 23 is preferably provided to the outer surface of this thinner portion.

It is preferable for one or more recesses 22f to be formed. The number of recesses 22f will depend on the size of the package 2, but is preferably no more than eight.

Preferably, two or more recesses 22f are formed, and a protrusion is formed in the Y axis direction between adjacent recesses 22f. Forming two or more recesses 22f allows thick portions of the first side wall 22h to be formed at a number of places, and this increases the strength of the first side wall 22b. This is because in the case where the first side wall 22b is too thin, and in the case where this thinner portion is too long in the X axis direction, cracks will tend to form in the side walls.

The inside of the cup 22a is filled with the light-transmissive member 3. The light emitting element 1 is sealed by the light-transmissive member 3.

The light emitting device 100 is mounted by placing the bottom surface opposite a mounting substrate, and using a conductive joining member such as solder to join external leads 21b to the wiring pattern of the mounting substrate.

In this way, a light emitting device having high light extraction efficiency can be provided.

Furthermore, a backlight light source can be provided which has a flat light guide with a main surface, a rear surface, and side surfaces, and in which the side surfaces of the light guide are opposite the recesses of the light emitting device.

The various components of the light emitting device 100 will now be described in more detail.

Light Emitting Element

An LED, an LD, or another such semiconductor light emitting element can be used to advantage as the light emitting element 1. This semiconductor light emitting element can be perferably formed by laminating ZnS, SiC, GaN, GaP, InN, AlN, Znse, GaAsP, GaAlAs, InGaN, GaAlN, AlInGaP, AlInGaN, or another such semiconductor over a substrate by a liquid phase growth method. HDVPE, or MOCVD. The semiconductor material is preferably a gallium nitride-based semiconductor expressed by $In_XAl_YGa_{1-X-Y}N$ ($0≤X$, $0≤Y$, $X+Y<1$) because various emission wavelengths can be selected, from ultraviolet light to infrared light, by selecting the crystal mixture ratio.

The light emitting element 1 is joined to an internal lead 21a of one polarity provided to the bottom surface of the cup 22a of the package 2 (a surface that is perpendicular to the Y axis direction). Also, positive and negative pad electrodes (anode and cathode) of the light emitting element 1 are electrically connect to the internal leads 21a of respectively corresponding polarity using bonding wires 4 composed of gold, silver, copper, aluminum, or the like.

One light emitting element 1 is mounted here, but two or more can be mounted instead. A plurality of light emitting elements may emit light of the same color or of different colors.

Package

The package 2 has the pair of leads 21, a resin component 22, and the reflective film 23. The package 2 is substantially cuboid in shape, flattened out and reduced the thickness in the Z axis direction (the thickness direction), and is suited to side-view mounting, which, can be used to advantage in light sources flit backlights in liquid crystal displays, etc.

The package 2 does not necessarily have to be applied to side-view mounting, and, may instead be applied to top-view.

Leads

The leads 21 are made up of internal leads 21a that are provided inside the resin component 22 and are used for mounting the light emitting element 1, and external leads 21b that stick out from the bottom surface side of the resin component 22 and serve as terminals for connecting to a mounting substrate. The leads 21 are split in two in the width direction (X axis direction) to correspond to the positive and negative polarity.

The leads 21 are formed using sheet metal, and may be in the form of a corrugated sheet or a sheet having convex and concave parts. Their thickness may be uniform, or they may be thicker or thinner in parts.

The internal leads 21a are provided exposed from the resin component 22 at the bottom surface of the cup 22a of the resin component 22 (a surface that is perpendicular to the Y axis). On the bottom surface of the cup 22a, the internal lead 21a is split in two, with one used as a positive electrode and the other as a negative electrode. The light emitting element 1 is joined to the internal leads 21a in a state in which the semiconductor layer is insulated from the internal leads 21a. The positive and negative pad electrodes of the light emitting element 1 are electrically connected to the internal leads 21a of polarity respectively corresponding to the pad electrodes using bonding wires 4.

The external leads 21b are formed continuously with the corresponding internal leads 21a, by polarity, stick out from the bottom surface of the resin component 22, are bent so as to extend to the rear surface side (+Y axis direction) along the bottom surface of the resin component 22, and are also partially bent so as to extend upward (+Z axis direction) along the left and right side surfaces of the resin component 22.

There are no particular restrictions on the material of which the leads 21 are made, but they are preferably thrilled from a material with relatively high thermal conductivity. Using a material such as this allows heat generated by the light emitting element 1 to be efficiently released to the outside via the external leads 21b. The material of which the leads 21 are made is preferably, for example, one having a thermal conductivity of about 200 W/(m·K) or higher, one having relatively high mechanical strength, or a material that is easily etched or stamped. More specifically, examples include copper, aluminum, gold, silver, tungsten, iron, nickel, and other such metals, as well as iron-nickel alloys, phosphor bronze, and other such alloys. Also, the surfaces of the internal leads 21a that are exposed on the bottom surface of the cup 22a are preferably given a reflective plating of silver or another material having good optical reflectivity in order for the light to be extracted more efficiently from the mounted light emitting element 1.

Resin Component

The resin component 22 has a 3-D shape defined by an X axis, a Y axis that is perpendicular to the X axis and a Z axis that is perpendicular to the X and axes. The resin component 22 is the matrix of the package 2, is provided so as to surround the internal leads 21a, and is used to support the leads 21. The external leads 21b that are continuous from the internal leads 21a stick out from the bottom surface of the resin component 22. The external leads 21b are provided such that they are bent along the bottom surface and the side surfaces of the resin component 22.

The resin component 22 has the cup 22a that is open on the front side of the light emitting device 100 (the axis direction). The internal leads 21a are provided so as to be exposed on the bottom surface of the cup 22a (a surface that, is perpendicular to the V axis and is oriented in the +Y axis direction), and the light emitting element 1 is mounted on the surfaces of the internal leads 21a exposed from the resin component 22.

A gate mark 22g, which is the mark of the gate through which the resin material is injected into molds in the formation of the resin component 22 by injection molding, is formed on the rear surface of the resin component 22.

The resin component 22 is formed from a material that is optically reflective because particles of a second optically reflective substance are contained in a light-transmissive resin, and also functions as a reflecting member that reflects light from the light emitting element 1 at the cup 22a, and efficiently emits the light in the front surface direction.

The cup 22a has an opening that is wider than it is tall in front view. That is, the opening of the upper part of the side walls extends in the X axis direction and the Z axis direction, and is longer in the X axis direction than in the Z axis direction. More specifically, the opening has an eight-sided shape in which the center part of the lower side of a rectangle bulges downward in a trapezoidal shape in front view. The internal leads 21a are provided to the bottom surface of the cup 22a. Also, the cup 22a is configured so that it is bounded by the first side wall 22b and the second side wall 22c provided opposite each other in the thickness direction of the light emitting device 100 (the Z axis direction), and by the third side wall 22d and the fourth side wall 22e provided opposite each other in the width direction of the light emitting device 100 (the axis direction), in other words, the first side wall 22b and the second side wall 22c extend along the axis and the X axis, the third side wall 22d and the fourth side wall 22e extend along the Y axis and the Z axis.

Here, the first side wall 22b and the second side, wall 22c are formed thinner than the third side wall 22d and the fourth side wall 22e. Thai is, a thickness of the side wall extending along Y axis and the X axis is less than a thickness of the side wall extending along Y axis and the Z axis. Also, part of the internal leads 21a provided on the bottom surface of the cup 22a extends to the outer surface side of the second side wall 22c, which is one of the thinner walls, sticks out from this outer surface side as the external leads 21b that serve as connector terminals with the outside, and extends bending along the lower surface of the resin component 22.

Thus, the light emitting device 100 has the leads 21 provided so as to be compatible with side-view mounting, and the resin component 22 is configured to make the side-view light emitting device 100 thinner.

Also, the third side wall 22d and the fourth side wall 22e have sloped inner surfaces such that the width of the cup 22a increases going from the bottom surface of the cup 22a on which the light emitting element 1 is mounted, toward the opening, in the width direction the X axis direction). Accordingly, light emitted from the light emitting element 1 and propagating laterally is reflected by these sloped inner surfaces and reflected in the front surface.

The inner surfaces of the first side wall 22b and the second side wall 22c are not sloped so that the light emitting device 100 will be thinner, and are instead constituted by surfaces that are substantially perpendicular to the bottom surface of the cup 22a. However, the first side wall 22b and the second side wall 22c may also be sloped so as to become wider going toward the opening.

The resin material used in the resin component 22 is preferably a thermoplastic resin or thermosetting resin having good light-transmissivity with respect to the wavelength of the light emitted by the light emitting element 1, or a mixture of these resins. Examples of the materials for the resin component 22 includes a silicone resin, a modified silicone resin, an epoxy resin, a modified epoxy resin, an urea resin, a phenol resin, a polycarbonate resin, an acrylic resin, a polymethyl pentene resin, a polynorbornene resin, a polyphthalamide amine resin, a polyphthalamide resin, a liquid crystal polymer, or a hybrid resin containing one or more, of those resins. A silicone resin or an epoxy resin is especially preferable, and a silicone resin with excellent resistance to light and heat is particularly preferable.

Particles of a material having good light-transmissivity and a large refractive index difference from the above-mentioned resin material is preferably used as the second optically reflective substance contained in the resin component 22.

This second optically reflective substance has a refractive index of at least 1.8, for example, and preferably at least 2.0, and more preferably at least 2.5 in order for the light to be efficiently scattered and a high light extraction efficiency to be obtained. The refractive index difference from the resin material is at least 0.4, for example, and preferably, at least 0.7, and more preferably at least 0.9 in order for the light to be efficiently scattered and a high light extraction efficiency to be obtained. Also, the average size of the particles of the second optically reflective substance is preferably at least 0.08 μm and no more than 5 μm, more preferably at least 0.1 μm and no more than 3 μm, and, still more preferably at least 0.3 μm and no more than 0.8 μm so that an optical scattering effect will be obtained at high efficiency.

In this Specification, the values for average particle size of the optically reflective substances, wavelength conversion substances, and so forth shall be those observed using an electron microscope. The unidirectional particle diameter was used, measured for the length in a constant axial direction, and a number basis (number distribution) was also used, in which the size of the particles was measured with an electron microscope (SEM, TEM).

More specifically, particles of $TiO_2$ (titanium oxide), $ZrO_2$ (zirconium oxide), MgO (magnesium oxide), $MgCO_3$ (magnesium carbonate), $Mg(OH)_2$ (magnesium hydroxide), $CaCO_3$ (calcium carbonate), $Ca(OH)_2$ (calcium hydroxide), $CaSiO_3$ (calcium silicate), ZnO (zinc oxide), $BaTiO_3$ (barium titanate), $Al_2O_3$ (aluminum oxide) or another such white pigment can be used as the second optically reflective substance. $TiO_2$ is particularly favorable because it is relatively stable with respect to moisture and so on, has a high refractive index, and also has excellent thermal conductivity.

Also, to obtain better reflectivity, it is preferable to use $TiO_2$ as the second optically reflective substance in the case where the light emitted by the light emitting element 1 is visible light of at least 420 nm, and it is preferable to use $Al_2O_3$ as the second optically reflective substance in the case of ultraviolet light.

The material of the resin contains, the second optically reflective substance to the extent that moldability is not compromised in the formation of the shape of the package. Therefore, the proportion in which the second optically reflective substance is contained in the resin component 22 is preferably at least 10 wt % and no more than 80 wt %, and more preferably at least 20 wt % and no more than 60 wt %.

The thinner is the resin component 22 containing the second optically reflective substance to the above extent, the more reflectivity will decrease and the more incident light is transmitted. Therefore, the reflective film 23 is provided to the outer surface of the walls surrounding the cup 22a. The reflective film 23 is provided within the recess 22f of the first outer surface of the first side wall 22b, but can also be provided to cover the entire outer surface of the resin component 22 surrounding the cup 22a. The reflective film 23 may be provided to all or part of the first side wall 22b and the 22c, which are wall components that are relatively thin. The first outer surface of the side walls preferably has a recess for forming the reflective film 23, which is recessed in the Z axis direction and arranged in a position corresponding to the opening.

Reflective Film

In the case where the resin component 22 contains the second optically reflective substance in a proportion of 30 wt %, for example, the reflective film 23 is preferably provided to at least part, of the area surrounding the cup 22a of the resin component 22, in the region where the film thickness is about 50 µm or less. In the portion with this range of film thickness, the amount of light transmitted by the resin component 22 is relatively high, so providing the reflective film 23 contributes particularly well to increasing the light extraction efficiency from the light emitting device 100 in the front surface direction.

In this embodiment, the reflective film 23 is provided within the recess 22f on the first outer surface of the first side wall 22b, but the reflective film 23 may instead be provided so as to cover part of the first side wall 22b and the second side wall 22c, which are the thinner wall components among the walls that surround the cup 22a. Also, the reflective film 23 may be provided to the outer surfaces on both sides of the recess 22f of the first side wall 22b, rather than in just the recess 22f of the first outer surface of the first side wall 22b. In this case, when the light emitting device 100 is mounted on a mounting substrate, a white resin layer, a metal film, or another such reflecting member is preferably provided over the mounting substrate opposite the second side wall 22c.

The reflective film 23 can be a resin layer that contains particles of the first optically reflective substance in a higher proportion than the resin component 22, and it is more preferable to use an aggregate film of particles of the first optically reflective substance formed by using a small amount of binder to bind the particles of the first optically reflective substance together.

The same substance can be used for both the first optically reflective substance and the second optically reflective substance, and $TiO_2$ is particularly favorable because it affords good reflectivity in the visible light band.

A binder need not be used, but it is preferable to use one in order to make the reflective film 23 less likely to peel away from the resin component 22. The binder is preferably a material with good, light transmissivity, heat resistance, and light resistance, and inorganic materials such as $SiO_2$, $Al_2O_3$, MSiO (M is Zn, Ca, Mg, Ba, Sr, Zr, Y, etc.), or organic materials such as epoxy or silicone resins can be used to advantage. Toluene, ethanol, or another such organic solvent can also be used as a binder. This is because the first optically reflective substance can be disposed at high density on the first outer surface of the first side wall 22b, and deterioration caused by the organic solvent used in the reflective film 23 can be lessened by volatilizing or otherwise removing the organic solvent.

For good optical reflectivity to be obtained, the proportion in, which the first optically reflective substance is contained in the reflective film 23 is preferably at least 60 wt %, and more preferably at least 90 wt %. Also, the proportion in which the first optically reflective substance is contained is preferably no more than 95 wt %, so as to obtain good bonding strength between the particles of the first optically reflective substance, and good adhesion between the resin component 22 and the particles of the first optically reflective substance. The remaining proportion is mainly the above-mentioned binder components.

The average size of the particles of the first optically reflective substance is preferably at least 10 nm and no more than 500 nm, more preferably at least 20 nm and no more than 500 nm, and even more preferably at least 30 nm and no more than 80 nm, so as to obtain a light scattering effect at high efficiency. This allows the first optically reflective substance to be disposed at high optical density, and reduces the amount of visible light transmitted by the reflective film 23.

The first optically reflective substance may consist of nanoparticles. In particular, since a reflective film 23 of high reflectance can be formed from a thin-film by thrilling an aggregated film of nanoparticles as the reflective film 23, this is preferable in terms of obtaining a thinner light, emitting device 100. Also, a dense film that will not readily separate from the surface of the resin component 22 can be obtained by using an aggregated film of nanoparticles as the reflective film 23, so a more reliable light emitting device 100 can be configured.

The reflective film 23 can be formed in a consistent film thickness, and a range of at least 20 nm to no more than 1.0 µm is preferable so that good reflectivity can be obtained.

The first optically reflective, substance and the second optically reflective substance may be made of the same substance or of different kinds of substances. The particle sizes of the first optically reflective substance and second optically reflective substance are preferably different, but can also be the same.

Light-Transmissive Member

The light-transmissive member 3 is provided so as to fill in the cup 22a of the resin component 22, and is a member that seals the light emitting element 1 mounted on the bottom surface of the cup 22a. Also, the light-transmissive member 3 may contain a wavelength conversion substance (phosphor) that converts the light emitted by the light emitting element 1 into light of a different wavelength. For example, the configuration may be such that the light emitting element 1 emits blue light and the wavelength conversion substance converts part of the blue light into yellow light, which allows white light that is a mixture of these light colors to be emitted from the light emitting device 100.

The light-transmissive member 3 may contain a plurality of types of wavelength conversion substance, or it may be contain a light scattering substance in addition to or instead of the wavelength conversion substance.

The light-transmissive member 3 is preferably a material that has good light-transmissivity with respect to the wavelength of light emitted by the light emitting element 1 and the wavelength of light emitted by the wavelength conversion substance, and that has good resistance to weather, light, and heat as a sealing member. This material can be the same resin material used for the resin component 22, or glass or the like.

Any wavelength conversion substance (phosphor) that is known in this field can be used. Examples include YAG phosphors (yttrium-aluminum-garnet) that are activated by cerium that emit green to yellow light, LAG (lutetium aluminum garnet) phosphors that are activated by cerium that emit green light, nitrogen-containing aluminosilicate calcium ($CaO$—$Al_2O_3$—$SiO_2$) phosphors that are activated by europium and/or chromium that emit green to red light, silicates ($(Sr, Ba)_2SiO_4$) phosphors that are activated by europium that emit blue to red light, β sialon phosphors that emit green light, nitride phosphors such as CASN phosphors represented by $CaAlSiN_3$ that are activated by europium or SCASN phosphors represented by $(Sr,Ca)AlSiN_3$:Eu, which are emit red light, KSF ($K_2SiF_6$:Mn) phosphor that emit red light, sulfide phosphors that emit red light, or the like.

Also, the light scattering substance can be the same as what is used in the first optically reflective substance or the second optically reflective substance.

Second Embodiment

Figure 4A:
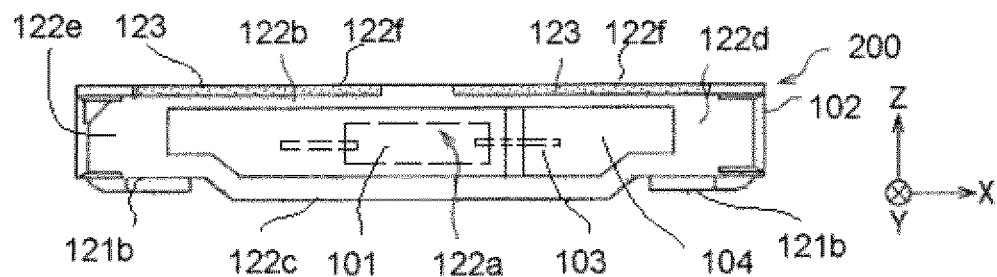
FIG. 4A is a front view of the light emitting device according to second embodiment.
Figure 4B:
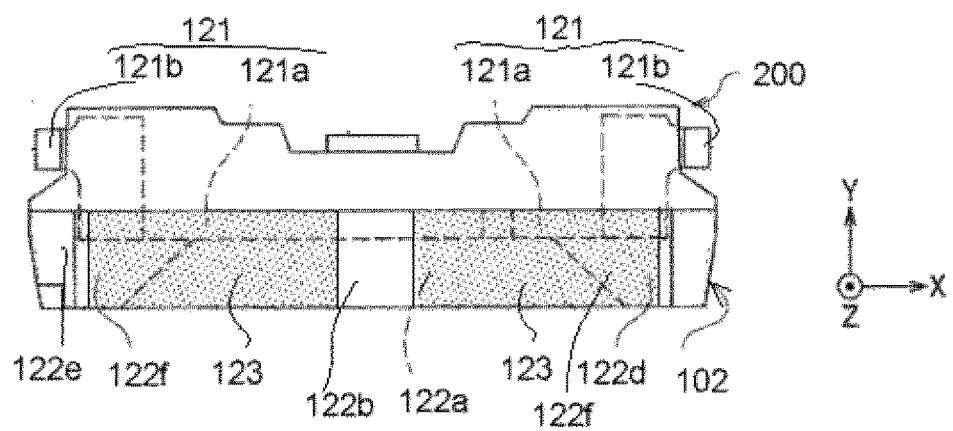
FIG. 4B is a plan top view of the light emitting device according to second embodiment.
Figure 4C:
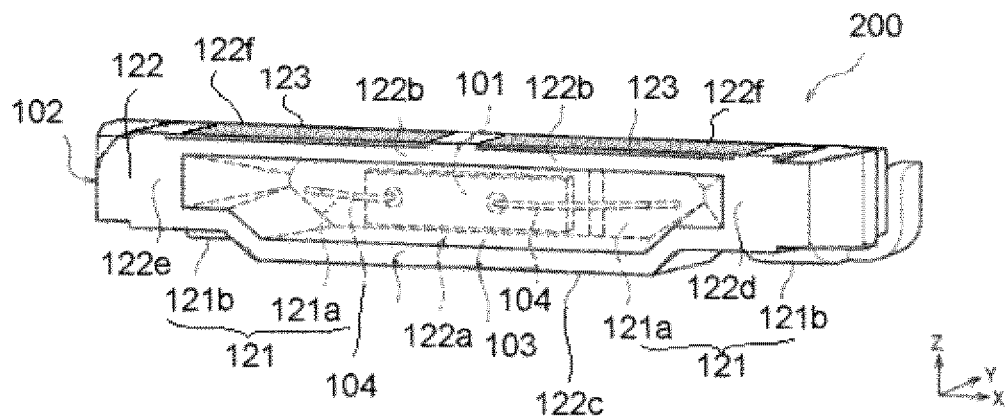
FIG. 4C is an oblique view of the light emitting device according to second embodiment.

Referring to figures, a description will be given of a configuration of a light emitting device according to the second embodiment. FIG. 4A is a front view of the light emitting device according to second embodiment, FIG. 4B is a plan top view of the light emitting device according to second embodiment, FIG. 4C is an oblique view of the light emitting device according to second embodiment, The light emitting device according to the second embodiment is substantially the same as the light emitting device according to the first embodiment, except that two recesses are provided to the first outer surface of the first side wall, and no recesses are provided to the second outer surface of the second side wall.

The light emitting device 200 according to the second embodiment includes a light emitting element 1, a package 2 and a light-transmissive member 3.

A package 102 has a bottom surface and side walls that surround the bottom surface, and a cup 122a is formed where the upper part of the side walls is open. The side walls consist of a first side wall 122b, a second side wall 122c, a third side wall 122d, and a fourth side wall 122e. Internal leads 121a are disposed from the bottom surface of the cup 122a, external leads 121b are disposed on the outside of the cup 122a, and a pair of leads 121 is disposed. A light emitting element 101 is provided inside the cup 122a, and the light emitted by the light emitting element 101 goes through a light-transmissive member 103 and exits the opening of the cup 122a in the front surface direction (the –Y axis direction). The light emitting element 101 is electrically connected to the pair of leads 121 via wires 104.

With the package 102, a first outer surface of a side wall extending in the X axis direction (the first side wall 122b) has two recesses 122f in the Z axis direction, and reflective films 123 are disposed in these two recesses 122f. One end of the two recesses 122f extends further outside (X axis direction) than the cup 122a. Consequently, light from the light emitting element 101 emitted in the +Z axis direction within the cup 122a can be reflected in the axis direction or the axis direction. There are no particular restrictions on the depth of the two recesses 122f (Z axis direction), but a range of 30 nm to 3 µm is preferable, and 50 nm to 1 µm is more preferable. A protrusion is formed between the two recesses 122f. The width of the protrusion (X axis direction) is preferably less than the lateral width of the light emitting element 101 (X axis direction). For example, it is from 50 to 500 µm. The protrusion, extends at the same width in the Y axis direction, and has the same length as the side walls within the cup 122a. This increases the strength of the side walls of the package 102.

The thickness of the reflective films 123 is preferably from 30 nm to 3 µm, more, preferably from 500 nm to 1 µm, and even more preferably from 50 to 500 nm. Reflection efficiency can be improved by making the thickness of the reflective films 123 be the same as the depth of the recesses 122f. On the other hand, the reflective films 123 can be prevented from peeling off or falling out by making the thickness of the reflective films 123 less than the depth of the recesses 122f.

Third Embodiment

Figure 5:
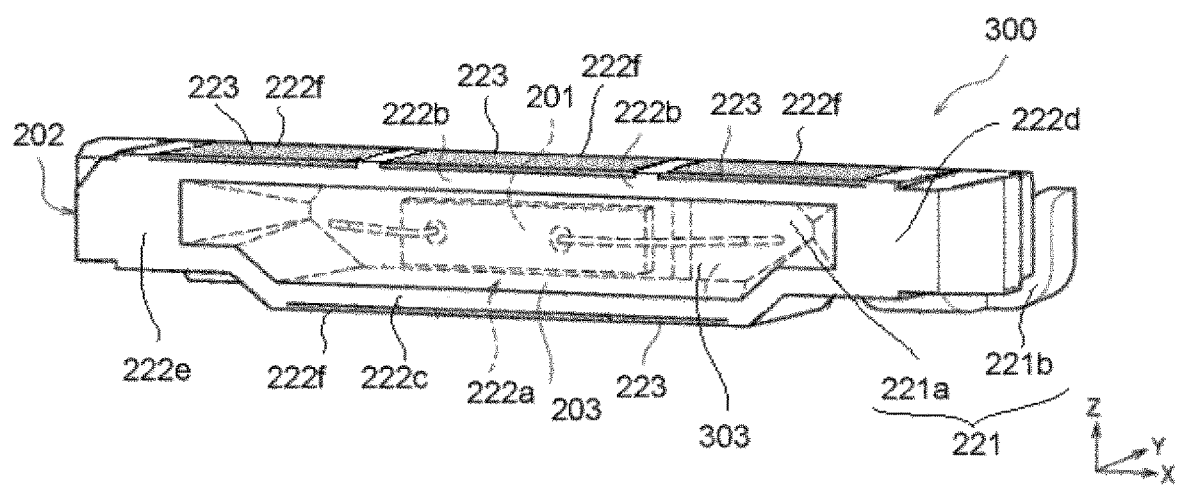
FIG. 5 is an oblique view of the light emitting device according to third embodiment.

Referring to figures, a description will be given of a configuration of a light emitting device according to the third embodiment. FIG. 5 is an oblique view of the light emitting device according to third embodiment.

The light emitting device according to the third embodiment is substantially the same as the light emitting device according to the first embodiment, except that three recesses are provided to the first outer surface of the first side wall.

The light emitting device 300 according to the third embodiment includes a light emitting element 201, a package 202, and a light-transmissive member 203.

The package 202 has a bottom surface and side walls that surround the bottom surface, and a cup 222a is formed where the upper part of the side walls is open. The side walls consist of a first side wall 222b, a second side wall 222c, a third side wall 222d, and a fourth side wall 222e. Internal leads 221a are disposed from the bottom surface of the cup 222a, external leads 221b are disposed on the outside of the cup 222a, and a pair of leads 221 is disposed. A light emitting element 201 is provided inside the cup 222a, and the light emitted by the light emitting element 201 goes through the light-transmissive member 203 and exits the opening of the cup 222a in the front surface direction (the –Y axis direction).

With the package 202, a first outer surface of a side wall extending in the X axis direction (the first side wall 222b) has three recesses 222f in the Z axis direction, and reflective films 223 are disposed in these three recesses 222f. Of the three recesses 222f, one end of the recesses 222f at both ends lies on substantially the same straight line as the cup 222a (Z axis direction). Consequently, light from the light emitting element 201 emitted in the +Z axis direction within the cup 222a can be reflected in the –Z axis direction or the –Y axis direction. The width may the same for all three of the recesses 222f (X axis direction), but it is preferable for the width of the middle recess to be greater than the width of the recesses on both sides. This allows the light emitted from the light emitting element 201 to be reflected more efficiently. There are no particular restrictions on the depth of the three recesses 222f (Z axis direction), but a range of 30 nm to 3 µm is preferable, and 50 nm to 1 µm is more, preferable. Two protrusions are formed between the three recesses 222f. The width of the protrusions (X axis direction) is preferably less than the lateral width of the light emitting element 201 (X axis direction). For example, it is from 50 to 500 µm. The protrusions extend at the same width in the Y axis direction, and have the same length as the side walls within the cup 222a. This increases the strength of the side walls of the package 202. Providing two protrusions prevents wear of the reflective film 223, and prevents the reflective film 223 from peeling off or falling out.

The thickness of the reflective films 223 is preferably from 30 nm to 3 µm, more preferably from 50 nm to 1 µm, and still more preferably from 50 nm to 500 nm. Reflection efficiency can be improved by making the thickness of the reflective films 223 be the same as the depth of the recesses 222f. On the other hand, the reflective films 223 can be prevented from peeling off or falling out by making the thickness of the reflective films 223 less than the depth of the recesses 222f.

Fourth Embodiment

Figure 6:
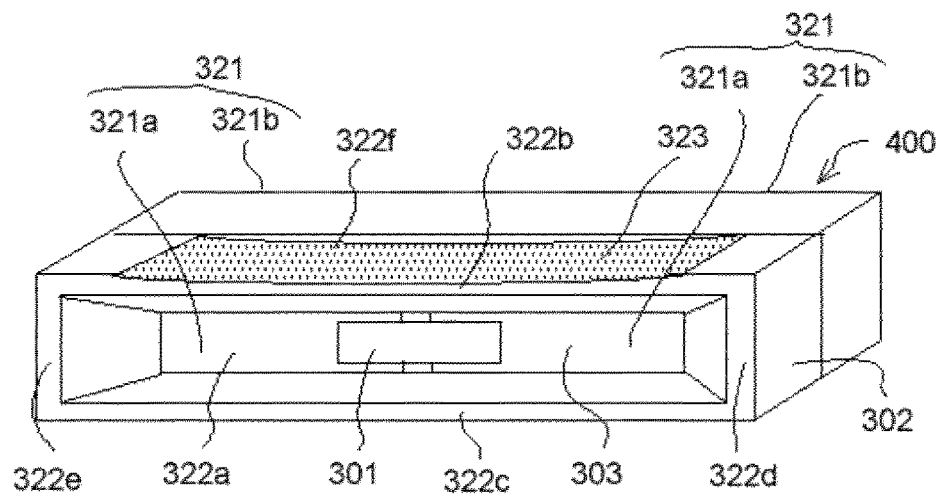
FIG. 6 is an oblique view of the light emitting device according to fourth embodiment.

Referring to figures, a description will be given of a configuration of a light emitting device according to the fourth embodiment. FIG. 5 is an oblique view of the light emitting device according to third embodiment. FIG. 6 is an oblique view of the light emitting device according to fourth embodiment.

The light emitting device 400 according to the fourth embodiment includes a light emitting element 301, a package 302, and a light-transmissive member 303. In the light emitting device according to the fourth embodiment, a curved recess 322f is provided to the first outer surface of a first side wall 322b. The light-transmissive member 303 may contain a wavelength conversion substance, a light scattering substance, or the like.

A package 302 has a bottom surface composed of a substrate, and side walls composed of a resin that surround the bottom surface, and a cup 322a is f-formed where the upper part of the side walk is open, the package 302, the cup 322a is formed by the substrate and the side walls. The side walls consist of a first side wall 322b, a second side wall 322c, a third side wall 322d, and a fourth side wall 322e. Internal leads 321a are disposed from the bottom surface of the cup 322a, external leads 321b are provided on the outside of the rear surface or side surface of the substrate, and a pair of leads 321 is disposed. The light emitting element 301 is mounted on the substrate within the cup 322a by surface-down mounting, and the light emitted by the light emitting element 301 goes through the light-transmissive member 303 and exits the opening of the cup 322a in the front surface direction (the −Y axis direction).

With the package 302, a first outer surface of a side wall extending in the X axis direction (the first side wall 322b) has a recess 322f that is curved in the Z axis direction, and a reflective film 323 is disposed in this recess 322f. The reflective film 323 is thicker near the center where the light emitting element 301 is mounted, and thins out moving away from the portion where the light emitting element 301 is mounted. This allows the light emitted from the light emitting element 301 in the axis direction within the cup 322a to be more effectively reflected in the −Z axis direction or the −Y axis direction. However, the upper surface of the reflective film 323 can also be substantially the same as the upper surface of the cup 322a (Z axis direction). There are no particular restrictions on the depth of the recess 322f (Z axis direction), but the deepest portion is preferably from 30 nm to 3 µm, and more preferably from 50 nm to 1 µm.

The thickness of the reflective film 323 is preferably from 30 nm to 3 µm, more preferably from 50 nm to 1 µm, and still more preferably from 50 to 500 nm. The thickness of the reflective film 323 may or may not be uniform. Reflection efficiency can be improved by making the thickness of the reflective film 323 the same as the depth of the recess 322f. On the other hand, the reflective film 323 can be prevented from peeling off or falling out by making the thickness of the reflective film 323 less than the depth of the recess 322f.

Fifth Embodiment

Figure 7A:
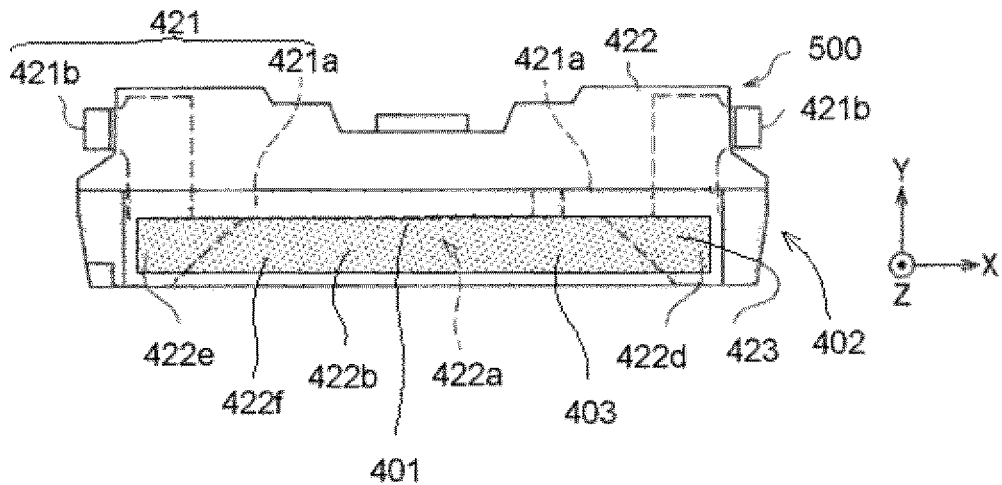
FIG. 7A is a from view of the light emitting device according to fifth embodiment.
Figure 7B:
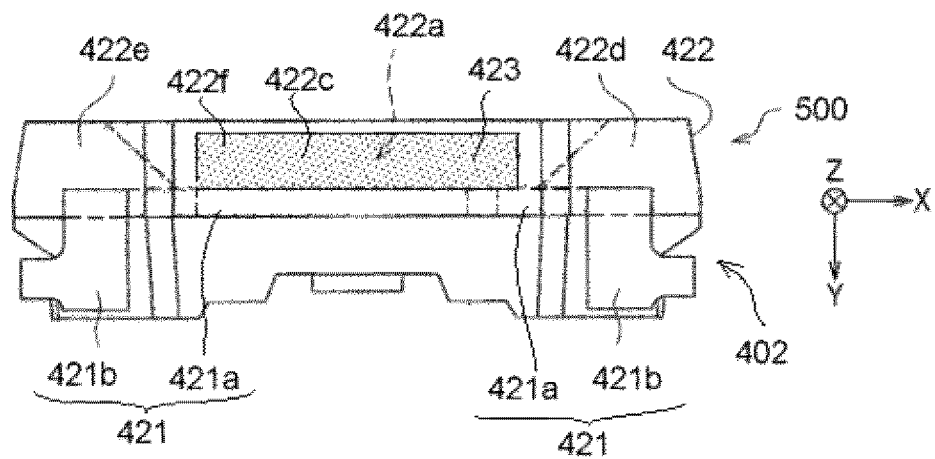
FIG. 7B is a bottom view of the light emitting device according to fifth embodiment.
Figure 7C:
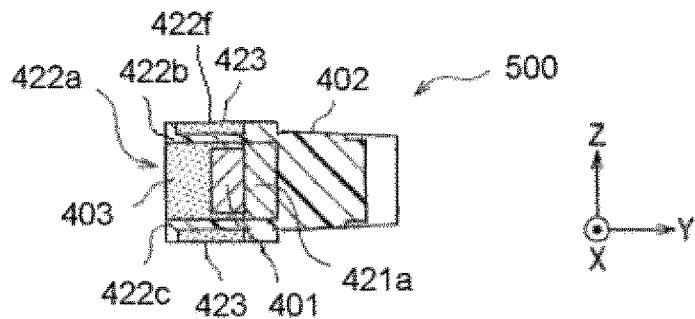
FIG. 7C is a cross section of the light emitting device according to fifth embodiment.

Referring to figures, a description will be given of a configuration of a light emitting device according to the fifth embodiment. FIG. 7A is a front view of the light emitting device according to fifth embodiment, FIG. 7B is a bottom view of the light emitting device according to fifth embodiment, FIG. 7C is a cross section of the light emitting device according to fifth embodiment.

The light emitting device according to the fifth embodiment is substantially the same as the light emitting device according to the first embodiment, except that a recess surrounding four sides is provided to the first outer surface of the first side wall.

The light emitting device 500 according to the fifth embodiment includes a light emitting element 401, a package 402, and a light-transmissive member 403.

The package 402 has a bottom surface and side walls that surround the bottom surface, and a cup 422a is formed where the upper part of the side walls is open. The side walls consist of a first side wall 422b, a second side wall 422c, a third side wall 422d, and a fourth side wall 422e. Internal leads 421a are disposed from the bottom surface of the cup 422a, external leads 421b are disposed on the outside of the cup 422a, and a pair of leads 421 is disposed. A light emitting element 401 is provided inside the cup 422a, and the light emitted by the light emitting element 401 goes through the light-transmissive member 403 and exits the opening of the cup 422a in the front surface direction (the −Y axis direction).

With the package 402, a first outer surface of a side wall extending in the X axis direction (the first side wall 422b) has a recess 422f surrounding four sides in the Z axis direction, and a reflective film 423 is disposed in this recess 422f. Since the recess 422f is provided so as to surround four sides, the reflective film 423 can be disposed at just the first outer surface of the first side wall 422b, without leaking out to the front surface side (the light emission surface). Consequently, light from the light emitting element 401 emitted in the +Z axis direction within the cup 422a can be reflected in the axis direction or the −Y axis direction. The width of the protrusion of the recess 422f on the front surface side (the −Y axis side) can be from 50 nm to 3 µm, but there are no particular restrictions on it. Nor are there any particular restrictions on the depth of the recess 422f (Z axis direction), but a range of 30 nm to 3 µm is preferable, and 50 nm to 1 µm, is more preferable. The width of the protrusion of the recess 422f (X axis direction) is preferably less, than the lateral width of the light emitting element 401 (X axis direction). For example, it is from 50 to 500 µm. The protrusion extends at the same width in the Y axis direction, and has the same length as the side walls within the cup 422a. This increases the strength of the side walls of the package 402. Providing the recess 422f so as to surround four sides, and providing the reflective film 423 to the recess 422f prevents wear of the outer surface of the package 402, and prevents the reflective film 423 from peeling off or falling out.

The thickness of the reflective film 423 is preferably from 30 nm to 3 µm, more preferably from 50 nm to 1 µm, and still more preferably from 50 nm to 500 nm. Reflection efficiency can be improved by making the thickness of the reflective film 423 be the same as the depth of the recess 422f. On the other hand, the reflective film 423 can be prevented from peeling off or falling out by making the thickness of the reflective film 423 less than the depth of the recess 422f.

The recess 422f can be provided by etching or other such chemical processing, or by polishing, pressing, or other such physical processing.

Operation of Light Emitting Device

The operation of the light emitting device 100 will now be described through reference to FIGS. 2A to 3B.

For the sake of convenience in the description, the light emitting element 1 will be described as one that emits blue light, and in which the light-transmissive member 3 contains a wavelength conversion substance that absorbs blue light and emits yellow light.

When the light emitting device 100 is connected to an external power supply via the external leads 21b, current is supplied through the internal leads 21a and the wires 4 to the light emitting element 1, and the light emitting element 1 emits blue light.

When the blue emitted by the light emitting element 1 propagates through the light transmissive member 3, part of it is converted into blue light by the wavelength conversion substance. Part of the light propagating through the light-transmissive member 3 in the thickness direction (axis direction) is reflected within the light-transmissive member 3 by the first side wall 22b or the second side wall 22c, and the light transmitted by the first side wall 22b or the second side wall 22c is reflected within the light-transmissive member 3 by the reflective film 23. Also, the light propagating through the light-transmissive member 3 in the width direction (X axis direction) is reflected within the light-transmissive member 3 by the third side wall 22d or the fourth side wall 22e, while the light propagating in the rear surface direction (±Y axis direction) is reflected within the light-transmissive member 3 by the internal leads 21a.

The light that propagates through the light-transmissive member 3 in the front surface direction of the light emitting device 100 (−Y axis direction), either directly from the wavelength conversion substance or after reflecting off the various members as discussed above, is emitted from the opening in the cup 22a as white light that is a mixture of blue light and yellow light.

Therefore, with the light emitting device 100, since light incident on the resin component 22 is returned by the reflective film 23 to inside the light-transmissive member 3 and emitted from the opening in the cup 22a, the light extraction efficiency from this opening is improved.

Method for Manufacturing Package and Light Emitting Device

The method for manufacturing the package 2 and the light emitting device 100 will now be described.

Package Manufacturing Method

First, the method for manufacturing the package 2 which is a constituent part of the light emitting device 100, will be described.

The method for manufacturing the package 2 includes a lead frame formation step S101, a resin component, formation step S102, and a reflective film formation step S103. The package 2 manufactured here is so-called a "precursor" which is one excluded the light emitting element 1 and the light-transmissive member 3 from the light emitting device 100.

Also, the lead frame formation step S101 and the resin component formation step S102 shall be collectively referred to as a package preparation step S201 for the sake of convenience. This package preparation step S201 is a step of forming the package 2 in a state prior to the formation of the reflective film 23.

Light Emitting Device Manufacturing Method

The following two methods are ways to manufacture the light emitting device 100, differing in the order in which the step of forming the reflective film 23 in the manufacture of the package 2 are performed and the step of mounting the light emitting element 1 on the package 2.

First Method for Manufacturing Light Emitting Device

Figure 8A:
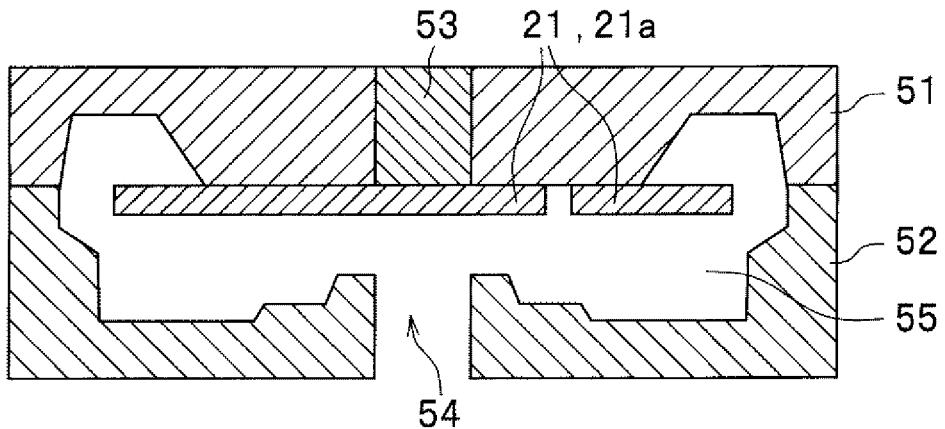
FIGS. 8A to 8D are schematic cross sectional views of the forming resin portion step of the light emitting device according to first embodiment.
Figure 8B:
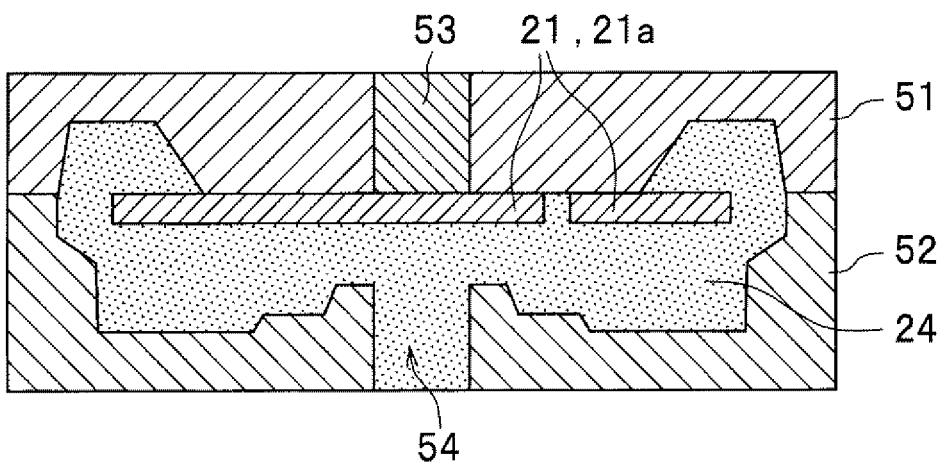
Figure 8C:
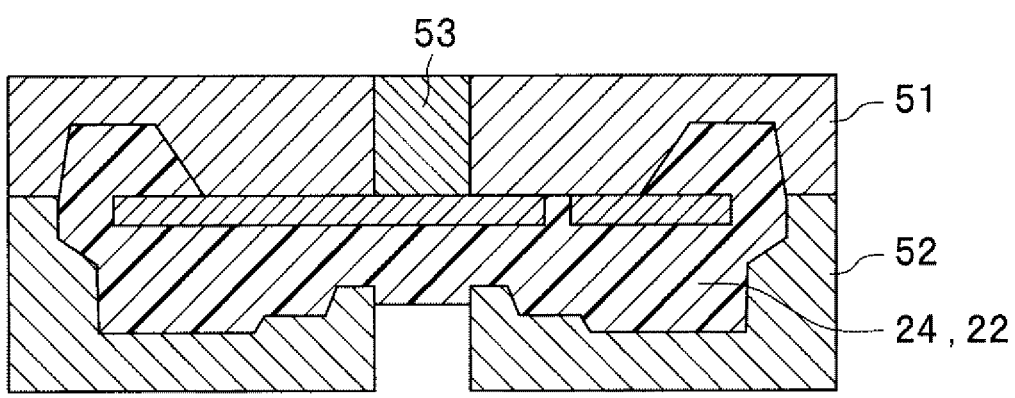
Figure 8D:
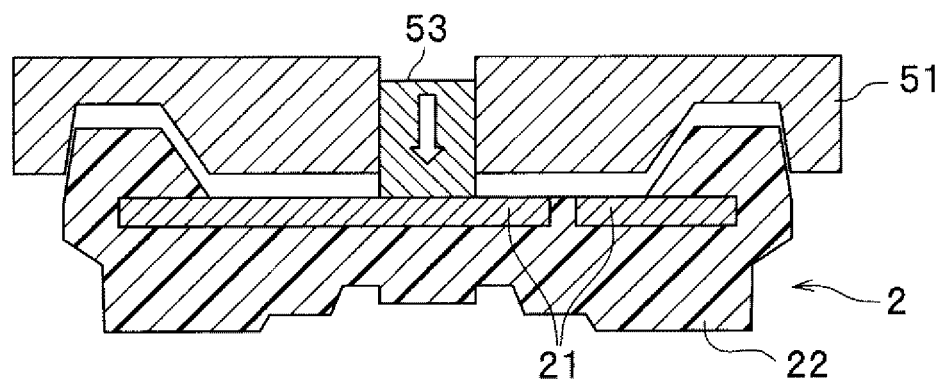
Figure 9A:
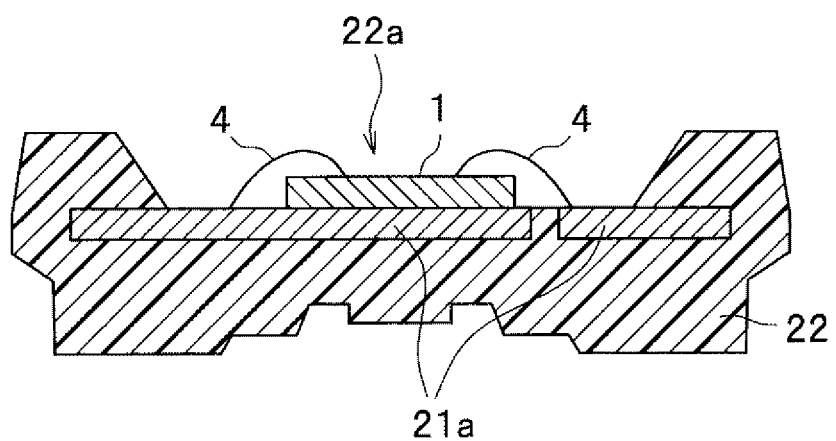
FIGS. 9A to 9D are schematic cross sectional views of the mounting a light emitting element step of the light emitting device according to first, embodiment.
Figure 9B:
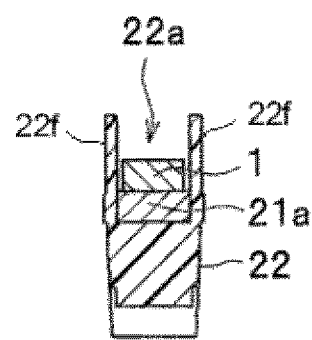
Figure 9C:
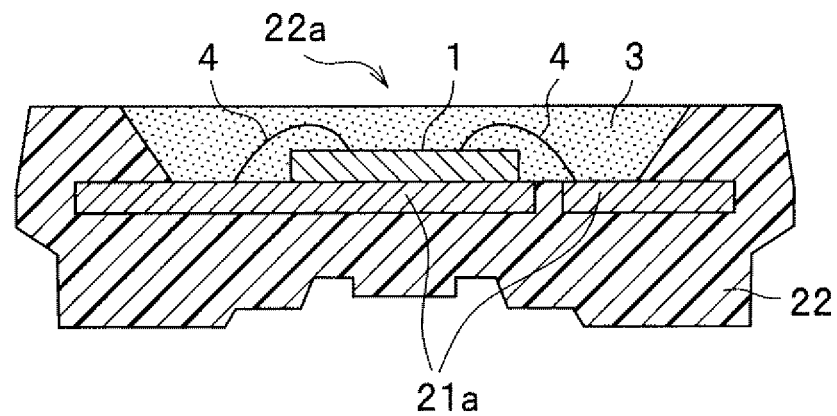
Figure 9D:
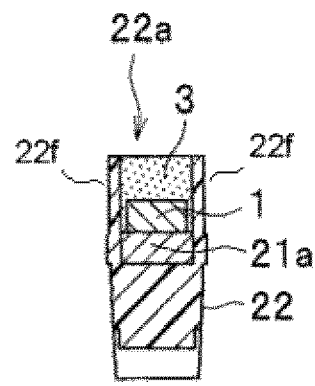

Referring to FIGS. 8A to 9D), a description will be given of first method for manufacturing the light emitting device 100. FIG. 8A is a schematic cross sectional view of the forming resin portion step of the light emitting device according to first embodiment, FIG. 8B is a schematic cross sectional view of the forming resin portion step of the light emitting device according to first embodiment, FIG. 8C is a schematic cross sectional view of the forming resin portion step of the light emitting device according to first embodiment, FIG. 8D is a schematic cross sectional view of the forming resin portion step of the light emitting device according to first embodiment, FIG. 9A is a schematic cross sectional view of the mounting a light emitting element step of the light emitting device according to first embodiment, FIG. 9B is a schematic cross sectional view of the mounting a light emitting element step of the light emitting device according to first embodiment, FIG. 9C is a schematic cross sectional view of the mounting a light emitting element step of the light emitting device according to first embodiment, FIG. 9D is a schematic cross sectional view of the mounting a light emitting element step of the light emitting device according to first embodiment.

FIGS. 9A to 9C are schematic cross sectional views along the IIIA-IIIA line in FIG. 2A and FIGS. 9B to 9D are schematic cross sectional views along the IIIB-IIIB line in FIG. 2A.

In the first method for manufacturing the light emitting device 100, first the package preparation step S201 is performed, then a light emitting element mounting step S202 of mounting the light emitting element 1, and then a light-transmissive member formation step S203 of forming the light-transmissive member 3, after which the reflective film formation step S103 is performed to complete the package 2.

First, in the package preparation step S201, a package 2 is prepared in a state of not having a reflective film 23. As discussed above, this step includes the lead frame formation step S101 and the resin component formation step S102.

In the lead frame formation step S101, the leads 21 are formed. More specifically, the leads 21 can be formed by punching out sheet metal, for example.

A plurality of leads 21 may be formed in a state of being connected within the plane of the sheet metal serving as the raw material. Also, the external leads 21b may be bent in this step, or the bending of the external leads 21b may be performed after the resin component formation step S102.

In the resin component formation step S102, the resin component 22 is formed by injection molding, for example, so as to encapsulate the internal leads 21a. This resin component formation step S102 includes four sub-steps.

The resin component 22 can be formed by transfer molding, compression molding, extrusion molding, or another such molding method in which molds are used.

First, in the first sub-step, the leads 21 formed in the lead frame formation step S101 are disposed so that the internal leads 21a will be sandwiched within an upper mold 51 and a lower mold 52. The upper mold 51 here is provided with an ejector pin 53 for removing the molded article from the upper mold 51. The lower mold 52 is provided with a gate 54 for pouring in the resin material. A cavity 55 surrounded by the upper mold 51 and the lower mold 52 is formed in the shape of the resin component 22. A protrusion is provided to the upper mold 51 at the portion corresponding to the first outer surface of the first side wall 22b.

In the second sub-step, a liquid resin material 24 is poured from the gate 54 into the cavity 55.

In the third sub-step, the liquid resin material 24 that was poured into the cavity 55 is hardened within the upper mold 51 and the lower mold 52 to form the resin component 22.

Then, in the fourth sub-step, the lower mold 52 is moved to separate it from the molded article, and the ejector pin 53 is pushed out toward the molded article to remove the molded article from the upper mold 51.

A package 2 in which the leads 21 and the resin component 22 are integrally molded is formed by the above steps. The recess 22f is formed in the Z axis direction in the first outer surface of the first side wall 22b.

In the light emitting element mounting step S202, the light emitting element 1 is mounted on the internal leads 21a exposed from the bottom surface of the cup 22a. More specifically, first the light emitting element 1 is die-bonded over the internal lead 21a of one polarity. Then the wires 4 are used to connect the positive and negative electrodes of the light emitting element 1 to the internal leads 21a of the corresponding polarities.

In the light-transmissive member formation step S203, the light-transmissive member 3 is formed within the cup 22a. This seals the light emitting element 1.

More specifically, a slurry produced by adding particles of a wavelength conversion substance, particles of a light scattering substance, or the like to the resin material that serves as the matrix for the light-transmissive member 3, is used to fill the inside of the cup 22a by potting or another such method. After this, the light-transmissive member 3 is formed by curing the resin material.

In the reflective film, formation step S103, the reflective film 23 is formed so as to cover the recess 22f on the first outer surface of the first side wall 22b, which is a thin wall component, out of the resin component 22 surrounding the cup 22a.

More specifically, the reflective film 23 can be formed by adding a binder and particles of a light reflecting member to a solvent, coating, the above-mentioned region with the resulting slurry, and drying the coating film. Examples of the method for forming the reflective film 23 include potting, inkjet, spraying, and application with a brush or sponge.

Reflective Film Formation Method 1

A description will be given of specific method for forming the reflective film.

Figure 10A:
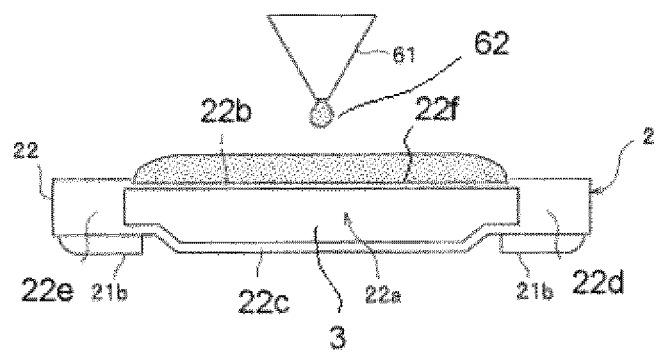
FIGS. 10A and 10B are schematic front views of one forming an anti-reflecting film step of the light emitting device according to first embodiment.
Figure 10B:
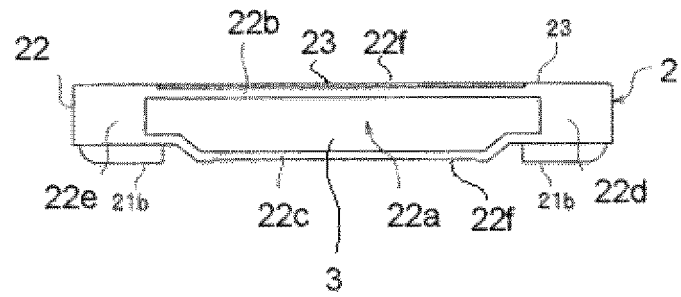

Referring, to FIGS. 10A and 108, a description will be given of first method for forming the reflective film 23. FIG. 10A is a schematic front view of one forming an anti-reflecting film step of the light emitting device according to first embodiment, and FIG. 10B is a schematic front view of one forming an anti-reflecting film step of the light emitting device according to first embodiment.

Potting is used as the first method for forming the reflective film 23. Potting forms the reflective film 23 on one surface at a time.

A binder and particles of a first optically reflective substance are added to a solvent to prepare a slurry 62, and a micropipette or other such dispenser 61 is used to drop this slurry 62 onto a specific region of the recess 22f and form a coating film. The coating film is formed over the entire upper surface of the recess 22f of the package 2 so that the slurry 62 rises up under surface tension at the ends of the upper surface. The reflective film 23 can be formed on just the upper surface, of the recess 22f of the package 2, without masking off the front surface side of the package 2, etc., by dropping the slurry 62 so that it does not overflow from the side surfaces.

The reflective film 23 is formed by volatilizing or drying the coating film of the slurry 62, that is, by removing the solvent. The coating film may be naturally dried by leaving it in a normal temperature environment, or it may be heated and dried. When a thermosetting resin, an alkyl silicate, or the like is used as a binder, the reflective film 23 can be bonded more securely to the resin component 22 by heating within a temperature range at which the resin material of the resin component 22, etc., will not be deformed or modified.

The reflective film 23 may be formed by repeating the application and drying of the slurry 62 two or more times.

Also, the reflective film 23 was provided to the outer surface of the first side wall 22b, but can also be formed on the outer surface of the second side wall 22c. In this case, after the reflective film 23 has been formed on the outer surface of the first side wall 22b by the above procedure, the package 2 is turned upside-down and the reflective film 23 can be formed on the outer surface of the second side wall 22c by the same procedure.

Reflective Film Formation Method 2

Figure 11A:
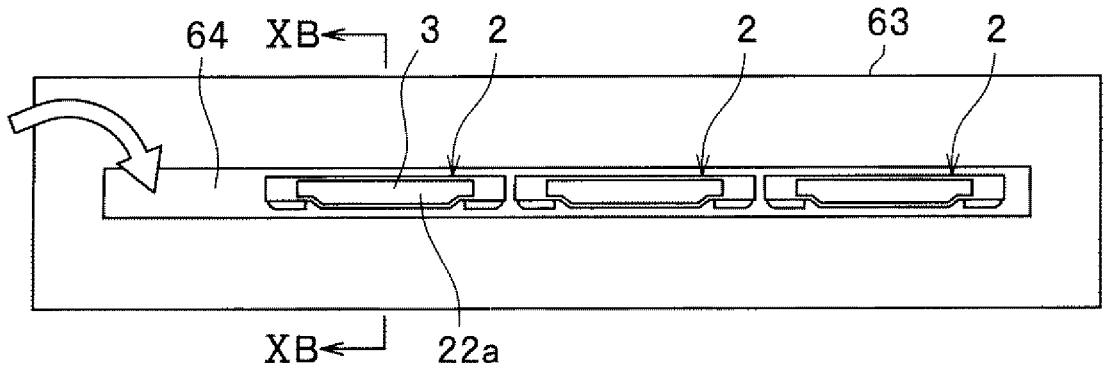
FIGS. 11A to 11E are schematic views of another forming an anti-reflecting film step of the light emitting device according to first embodiment.
Figure 11B:
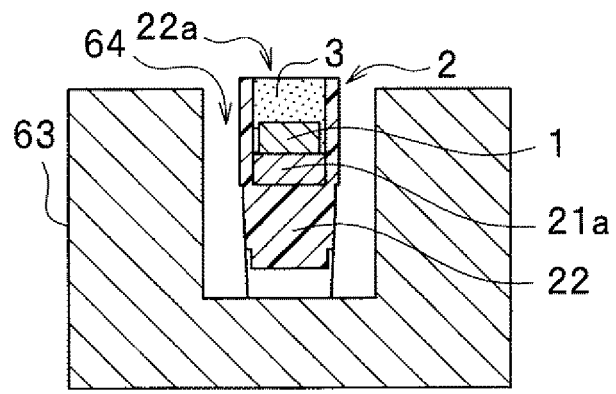
Figure 11C:
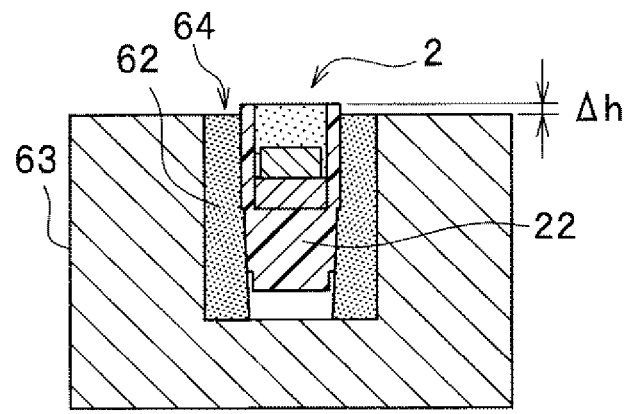
Figure 11D:
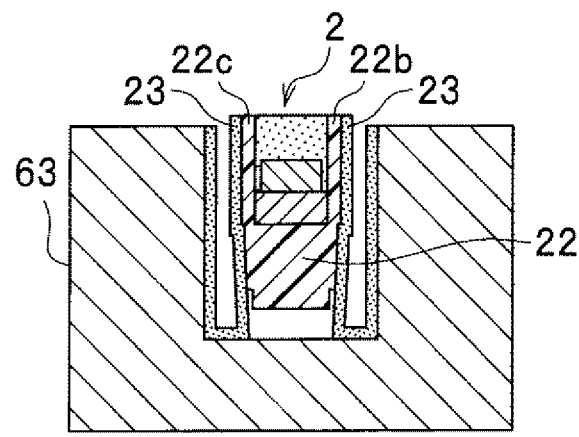
Figure 11E:
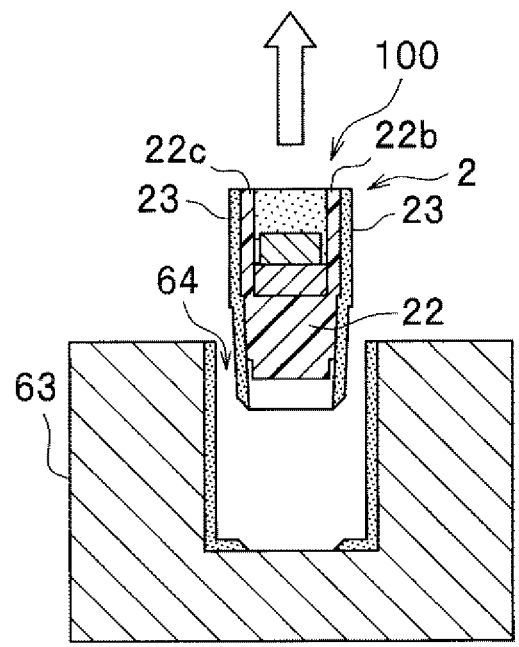

Referring to FIGS. 11A to 11E, a description will be given of second method for forming the reflective film 23. FIGS. 11A to 11E are schematic views of another forming an anti-reflecting film step of the light emitting device according to first embodiment, FIGS. 11B to 11C are cross section views along the XB-XB line in FIG. 11A.

The package 2 is disposed on a holding stand 63 having a groove 64, so that the front surface is facing up. The depth of the groove 64 is preferably slightly less than the front-to-back length of the package 2. Consequently, when the package 2 is disposed in the groove 64 with its rear surface facing down, the front surface of the package 2, that is, the position of the open end of the cup 22a, will be slightly higher than the upper surface of the holding stand 63.

The slurry 62 is introduced into the groove 64, and the slurry 62 is made to impregnate the whole surface other than the front surface of the package 2. The introduction of the slurry 62 into the groove 64 is done with a micropipette or the like, and the slurry is introduced into the groove 64 through the gaps where the package 2 is not disposed.

The slurry 62 can be prepared the same way as in the first formation method.

Here, in the case where Δh will be the difference between the front-to-back length of the package 2 and the depth of the groove 64, then Δh is preferably about 0.1 mm, for example. This more effectively prevents the slurry 62 from contaminating the opening surface of the cup 22a, even when the slurry 62 is introduced up to the upper end of the groove 64.

An aggregate film of particles of the first optically reflective substance can be formed as the reflective film 23 over the whole surface other than the front surface of the package 2 by drying the slurry 62 introduced into the groove 64. The reflective film 23 is also formed on the inner surfaces of the groove 64.

The introduction and drying of the slurry 62 are not limited to being performed just once, and may be repeated a number of times. Repeating the introduction and drying a number of times allows the reflective film 23 to be made thicker, and prevents light from escaping.

The width of the groove 64 can be determined by, taking into consideration in the thickness of the package 2 and the thickness of the reflective film 23 formed after the slurry 62 has been dried.

The package 2 is removed from the groove 64.

Finally, the upper surface of the first side wall 22b, except for the recess 22f of the package 2, is polished, and the reflective film adhering to the upper surface of the first side wall 22b is scraped off. This gives a package 2 in which the reflective film 23 is formed only inside the recess 22f on the first side wall 22b. The reflective film 23 adhering to the upper surface of the first side wall 22b, except for the recess 22f of the package 2, is more prone to falling off than the film inside, the recess 22f, and the reflective film particles and so forth that do fall off become debris, but this debris can be reduced with this second formation method.

With the second formation method, the reflective film 23 is formed over the entire outer surface, except for the front surface side of the resin component 22, including the outer surfaces of the third side wall 22d and the fourth, side wall 22e (thicker wall components), and not just on the outer surface of the second side wall 22c and inside the recess 22f of the first side wall 22b (thinner wall components) surrounding the cup 22a.

Second Method for Manufacturing Light Emitting Device

A description will be given of second method for manufacturing the light emitting device 100.

In the second manufacturing method, the package preparation step S201 and the reflective film formation step S103 are performed first to complete the package 2, after which the light emitting element mounting step S202 and the light-transmissive member formation step S203 are performed.

With the second manufacturing method, first, in the package preparation step S201, the package 2 is prepared in a state of not having the reflective film 23.

Then, the reflective film formation step S103 is performed to form the reflective film 23 in the outer surface region inside the recess 22f of the first side wall 22b of the resin component 22 of the package 2 prepared in the package preparation step S201. This completes the package 2.

Next, the light emitting element mounting step S202 and the light-transmissive member formation step S203 are performed in that order to manufacture the light emitting device 100.

The various steps of the second manufacturing method are the same as the similarly numbered steps in the first manufacturing method, and therefore will not be described again in detail.

As described above, with both the first manufacturing method and the second manufacturing method, the reflective film 23 can be formed on the outer surface within the recess 22f of the first side wall 22b of the resin component 22 by the simple method of coating. In particular, when a slurry containing nanoparticles of the first optically reflective substance is used, the reflective film 23 can be simply formed as a thin-film with good reflectivity.

Therefore, the package 2 provided with the reflective film 23, and the light emitting device 100 in which this package 2 is used can be manufactured with ease.

Example 1

A description will be given of an example of a light emitting device according to the embodiment. A side-view type of light emitting device with the shape shown in FIGS. 1 to 3B is produced by the procedure given below.

(1) Prepare a light emitting device 100 with no reflective film 23 formed on the outer surface of the resin component 22.

The resin component 22 of the light emitting device thus prepared was produced under the following conditions.

Resin Component Production Conditions

The second optically reflective substance ($TiO_2$ particles with an average size of 0.2 μm) are added to the resin component 22 so that their content will be 30 wt %.

Resin material of resin component 22: polyphthalamide

Thickness of first side wall 22b and second side wall 22c: 50 μm

Depth of recess 22f: 2 μm (2) Prepare a slurry under the following conditions.

Slurry Preparation Conditions

Solvent: toluene

First optically reflective substance: $TiO_2$ particles with an average size of 36 nm are added in an amount of 0.6 wt % in the slurry.

(3) Drop the prepared slurry onto the outer surface within the recess 22f of the first side wall 22b of the resin component 22 by the first method for forming a reflective film discussed above, and allow the slurry to dry naturally to form an aggregate film of $TiO_2$ particles as the reflective film 23. The thickness of the reflective film is 70 to 100 nm.

Example 2

A light emitting device was prepared in which the thickness was different between the first side wall 22b and the second side wall 22c of the resin component 22, and the reflective film 23 was formed in the same manner as in Example 1. The thickness of the first side wall 22b was 30 μm, and the thickness of the second side wall 22c was 70 μm. The depth of the recess 22f was 1 μm, and the thickness of the reflective film 23 was 50 to 100 μm. This allowed the first side wall 22b side, to be made thinner, and also reduced leakage of light from the light emitting element toward the first side wall 22b.

Example 3

The reflective film 23 was thrilled by changing the proportional content of the first optically reflective substance in the slurry and the number of times the coating step of dropping on the slurry and drying it, among the conditions for forming the reflective film 23. When the proportional content of the first optically reflective substance and the number of coatings are changed, the thickness of the reflective film 23 also changes. The rest of the conditions were the same as in Example 1.

The higher is the content of the first optically reflective substance in the slurry, and the more times the coating step is performed, the greater will be the effect of providing the reflective film 23 on increasing the light flux in the front surface direction, and on reducing light leakage from the resin component 22.

Example 4

In the conditions for preparing the slurry, an alkyl silicate that served as an inorganic, binder was added. The rest of the conditions were the same as in Example 1.

The light emitting device, package, and method for manufacturing these according to the present invention were described above in specific terms through embodiments of the invention and Examples thereof, but then gist of the present invention is not limited to or by these embodiments and examples, and must be broadly interpreted on the basis of what is stated in the Claims. Also, the gist of the present invention also encompasses various modifications, changes, and so forth based on these embodiments and examples.

A light emitting element according to the present disclosure cart be suitably employed for various lighting apparatuses, in particular, backlight source for a liquid crystal display device, a light source for lighting, a large-sized display, display panels for advertising or guidance message, image reader for digital video cameras, facsimile, scanner, a projector, or the like.

What is claimed is:

1. A method for manufacturing a package comprising:
   molding a precursor of a package including
   a cup-shaped resin component having a bottom surface and side walls that surround the bottom surface, an opening which is opened at an upper part of the side walls, and
   a pair of leads exposed on part of the bottom surface, the resin component having a 3-D shape defined by an X axis, a Y axis that is perpendicular to the X axis and a Z axis that is perpendicular to the X and Y axes, the opening of the upper part of the side walls extending in the X axis direction and the Z axis direction, and being longer in the X axis direction than in the Z axis direction, the side walls including at least one side wall that extends along the Y axis and the X axis and that has a first outer surface, and at least one side wall that extends along the Y axis and the Z axis, a thickness of the at least one side wall extending along Y axis and the X axis being less than a thickness of the at least one side wall extending along Y axis and the Z axis, and the first outer surface of the at least one side wall extending along the Y axis and the X axis having a recess which is recessed in the Z axis direction and which has a bottom face extending generally along the Y axis and the X axis, the recess being arranged in a position corresponding to the opening; and forming a reflective film in the recess covering the bottom face of the recess.

2. The method for manufacturing a package according to claim 1, wherein
the forming of the reflective film includes forming the reflective film by potting, inkjet, or spraying.

3. The method for manufacturing a package according to claim 1, wherein,
the forming of the reflective film includes dispersing a reflective member in an organic solvent or a resin, and applying a resulting slurry in the recess.

4. The method for manufacturing a package according to claim 1, wherein the molding of the precursor of the package includes molding the precursor of the package so that an end of the recess in the X axis direction on the side walls extending in the X axis direction is an outside of a position corresponding to the opening.

5. The method for manufacturing a package according to claim 1, wherein the molding of the precursor of the package includes molding the precursor of the package so that
the at least one side wall extending along the Y axis and the X axis includes a first side wall and a second side wall that are opposite each other,
the at least one side wall extending along the Y axis and the Z axis includes a third side wall and a fourth side wall that are opposite each other,
the first outer surface is an outer surface of the first side wall, and
the pair of leads are disposed on the outside of the second side wall.

6. The method for manufacturing a package according to claim 5, wherein the molding of the precursor of the package includes molding the precursor of the package so that a thickness of the first side wall of the recess portion is 30 to 100 μm.

7. The method for manufacturing a package according to claim 1, wherein the molding of the precursor of the package includes molding the precursor of the package so that the depth of the recess in the Z axis direction is from 20 nm to 5 μm.

8. The method for manufacturing a package according to claim 1, wherein the molding of the precursor of the package includes molding the precursor of the package so that an end of the recess in the Y axis direction on the side walls is flush with the lower surface of the pair of leads.

9. The method for manufacturing a package according to claim 1, wherein
the molding of the precursor of the package includes molding the precursor of the package so that the first outer surface has two or more recesses including the recess, and a protrusion is formed in the Y axis direction between adjacent ones of the recesses.

10. The method for manufacturing a package according to claim 1, wherein
the forming of the reflective film includes forming the reflective film only in the recess such that a thickness of the reflective film as measured in the Z axis direction is the same as or less than a depth of the recess as measured in the Z axis direction.

11. A method for manufacturing a light emitting device comprising:
molding a precursor of a package including
a cup-shaped resin component having a bottom surface and side walls that surround the bottom surface, an opening which is opened at an upper part of the side walls, and
a pair of leads exposed on part of the bottom surface,
the resin component having a 3-D shape defined by an X axis, a Y axis that is perpendicular to the X axis and a Z axis that is perpendicular to the X and Y axes,
the opening of the upper part of the side walls extending in the X axis direction and the Z axis direction, and being longer in the X axis direction than in the Z axis direction,
the side walls including at least one side wall that extends along the Y axis and the X axis and that has a first outer surface, and at least one side wall that extends along the Y axis and the Z axis,
a thickness of the at least one side wall extending along Y axis and the X axis being less than a thickness of the at least one side wall extending along Y axis and the Z axis, and
the first outer surface of the at least one side wall extending along the Y axis and the X axis having a recess which is recessed in the Z axis direction and which has a bottom face extending generally along the Y axis and the X axis, the recess being arranged in a position corresponding to the opening,
mounting a light emitting element on the pair of leads on the bottom surface; and
forming a reflective film in the recess covering the bottom face of the recess.

12. The method for manufacturing a light emitting device according to claim 11, wherein
the forming of the reflective film includes forming the reflective film by potting, inkjet, or spraying.

13. The method for manufacturing a light emitting device according to claim 11, wherein,
the forming of the reflective film includes dispersing a reflective member in an organic solvent or a resin, and applying a resulting slurry in the recess.

14. The method for manufacturing a light emitting device according to claim 11, wherein
the molding of the precursor of the package includes molding the precursor of the package so that an end of the recess in the X axis direction on the side walls extending in the X axis direction is an outside of a position corresponding to the opening.

15. The method for manufacturing a light emitting device according to claim 11, wherein the molding of the precursor of the package includes molding the precursor of the package so that
the at least one side wall extending along the Y axis and the X axis includes a first side wall and a second side wall that are opposite each other,
the at least one side wall extending along the Y axis and the Z axis includes a third side wall and a fourth side wall that are opposite each other,
the first outer surface is an outer surface of the first side wall, and
the pair of leads are disposed on the outside of the second side wall.

16. The method for manufacturing a light emitting device according to claim 15, wherein
the molding of the precursor of the package includes molding the precursor of the package so that a thickness of the first side wall of the recess portion is 30 to 100 μm.

17. The method for manufacturing a light emitting device according to claim 11, wherein
the molding of the precursor of the package includes molding the precursor of the package so that the depth of the recess in the Z axis direction is from 20 nm to 5 μm.

18. The method for manufacturing a light emitting device according to claim 11, wherein
the molding of the precursor of the package includes molding the precursor of the package so that an end of the recess in the Y axis direction on the side walls is flush with the lower surface of the pair of leads.

19. The method for manufacturing a light emitting device according to claim 11, wherein
the molding of the precursor of the package includes molding the precursor of the package so that the first outer surface has two or more recesses including the recess, and a protrusion is formed in the Y axis direction between adjacent ones of the recesses.

20. The method for manufacturing a light emitting device according to claim 11, wherein
the forming of the reflective film includes forming the reflective film only in the recess such that a thickness of the reflective film as measured in the Z axis direction being the same as or less than a depth of the recess as measured in the Z axis direction.

* * * * *